(12) United States Patent
Chan et al.

(10) Patent No.: US 7,356,756 B1
(45) Date of Patent: *Apr. 8, 2008

(54) SERIAL COMMUNICATIONS DATA PATH WITH OPTIONAL FEATURES

(75) Inventors: Allen Chan, Fremont, CA (US); Faisal Dada, Ottawa (CA); Karl Lu, Nepean (CA); Bryon Moyer, Cupertino, CA (US); Venkat Yadavalli, Santa Clara, CA (US); Arye Ziklik, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 490 days.

This patent is subject to a terminal disclaimer.

(21) Appl. No.: 10/923,376

(22) Filed: Aug. 20, 2004

(51) Int. Cl.
*H03M 13/00* (2006.01)

(52) U.S. Cl. .................... 714/781; 714/798

(58) Field of Classification Search .......... 714/781, 714/700, 798; 375/224, 238, 222; 710/305
See application file for complete search history.

(56) References Cited

U.S. PATENT DOCUMENTS

| | | | | |
|---|---|---|---|---|
| 4,462,105 A | * | 7/1984 | Wagner et al. | 375/222 |
| 5,235,332 A | * | 8/1993 | Stephenson, Jr. | 341/50 |
| 6,275,526 B1 | * | 8/2001 | Kim | 375/238 |
| 6,865,222 B1 | * | 3/2005 | Payne | 375/224 |
| 7,020,729 B2 | * | 3/2006 | Taborek et al. | 710/305 |
| 2003/0182619 A1 | * | 9/2003 | Greiss et al. | 714/798 |

OTHER PUBLICATIONS

"IEEE Std 802.3-2002, Section One; Local and Metropolitan Area Networks, Information technology—telecommunications and information exchange between systems—Local and metropolitan area networks—specific requirements—Part 3: Carrier Sense Multiple Access with Collision Detection (CSMA/CD) access method and physica layer specifications." pp. 1-135, (c) 2002 IEEE.
"Draft Supplement to IEEE Std.802.3; IEEE draft P802.3ae/D5.0," May 1, 2002, pp. 295-308.
"Aurora Protocol Specification; SP002(v1.1)," pp. 1-64, protocol specification of Xilinx, Inc. (Feb. 14, 2003).

(Continued)

*Primary Examiner*—Shelly Chase
*Assistant Examiner*—Fritz Alphonse
(74) *Attorney, Agent, or Firm*—G. Victor Treyz

(57) ABSTRACT

Integrated circuits compliant with a serial communications protocol with optional and adjustable features are provided. Tools for designing such circuits are also provided. The protocol supports different data transmission modes such as streaming data and packetized data. A regular data port and priority data port may be provided so that priority data may be nested inside regular data during transmission. Various levels of data integrity protection may be provided. If no data integrity protection is desired, a user can opt to omit data integrity protection from a given integrated circuit design, thereby conserving resources. If data integrity protection is desired, the user can select from different available levels of data integrity protection. Data may be multiplexed using user-defined data channels.

16 Claims, 23 Drawing Sheets

OTHER PUBLICATIONS

"InfiniBand Architecture Specification vol. 1, Release 1.1" Nov. 6, 2002, pp. 1-211, Specification of the InfiniBand Trade Association.

"InfiniBand Architecture Specification vol. 2, Release 1.1" Nov. 6, 2002, pp. 1-163, Specification of the InfiniBand Trade Association.

"CompactPCI Serial Mesh Backplane Specification; PICMG 2.2 R1.0," Oct. 21, 2002, pp. i-vi and 1-37 Specification of the PCI Industrial Computer Manufacturers Group.

"CSIX-L1: Common Switch Interface Specification-L1," pp. i-v and 1-63, Aug. 5, 2000 Specification of CSIX of Palo Alto, CA.

"RapidIO Interconnect Specification; Part VI: Physical Layer 1x/4x LP-Serial Specification," Rev. 1.2 Jun. 2000, pp. i-xx, VI-1 to VI-136 and Glossary-1 to Glossary-6.

PCI Express Base Specification, Rev. 1.0app. 34-40 and 119-220.

* cited by examiner

SERIAL COMMUNICATIONS DATA PATH WITH OPTIONAL FEATURES

BACKGROUND OF THE INVENTION

This invention relates to serial communications, and more particularly, to serial communications protocols having a data path with optional features.

Serial communications formats are often used in modern electronics systems. Serial communications can be faster than parallel communications, use fewer pins, and, particularly when differential signaling schemes are used, can have higher noise immunity.

It can be challenging to handle serial data streams at high data rates (e.g., at data rates above several Gbps). As a result, it is often advantageous to support high-speed serial data communications using multiple smaller serial data paths (lanes) operating in parallel.

A number of functions are involved in controlling the operation of a successful serial communications link. Serial communications protocols in which these functions are mandatory can become "heavy" and require a large amount of resources to implement on an integrated circuit. Serial communications protocols that do not support these functions do not require as many resources to implement, but can be inadequate for many communications tasks.

SUMMARY OF THE INVENTION

In accordance with the present invention, a serial communications protocol is provided that provides support for data path features such as streaming data and packetized data, priority packet nesting, and data integrity protection (e.g., using cyclic redundancy checking arrangements). These features are optional, which allows a logic designer to decide whether or not a given integrated circuit should include circuitry for supporting streaming data or packetized data, priority packet nesting, and data integrity protection. If these features are implemented on a circuit, the circuit will automatically perform the functions associated with the features. If these features are not implemented on a circuit, resources will be conserved. The optional features may be adjustable to allow a user to select how the optional feature will work when implemented in a given design.

Logic design tools are provided for designing integrated circuits compliant with the protocol. Integrated circuits constructed in accordance with the present invention may be programmable logic device integrated circuits or other suitable integrated circuits such as digital signal processing circuits, microprocessor circuits, application specific integrated circuits, etc.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to serial communications protocols. More particularly, the present invention relates to a serial communications protocol with data path functions such as support for streaming and packetized data, priority packet encapsulation and nesting, and data integrity protection. These functions are optional and adjustable. A logic designer can either conserve integrated circuit resources by forgoing features or can enhance the capabilities of an integrated circuit by implementing features. If the features are implemented, the logic designer can make adjustments to the way in which the features operate. The invention also relates to computer-aided design tools that help logic designers design integrated circuits using the serial communications protocol. Another aspect of the invention relates to circuits that are compliant with the protocol and methods for using these circuits.

Serial communications may involve a single path (i.e., a single differential pair of signal wires over which data is conveyed in series) or may involve multiple parallel serial paths (called lanes). In a multi-lane arrangement, a relatively higher-rate serial link is formed from multiple parallel relatively lower-rate serial paths. For example, four lanes operating at about 3.125 Gbps may be used in parallel to support the functions of a 12.5-Gbps serial link. This is merely one illustrative configuration. The data streams from any number of lower-rate serial channels may be combined to form a higher-rate serial link.

Figure 1:
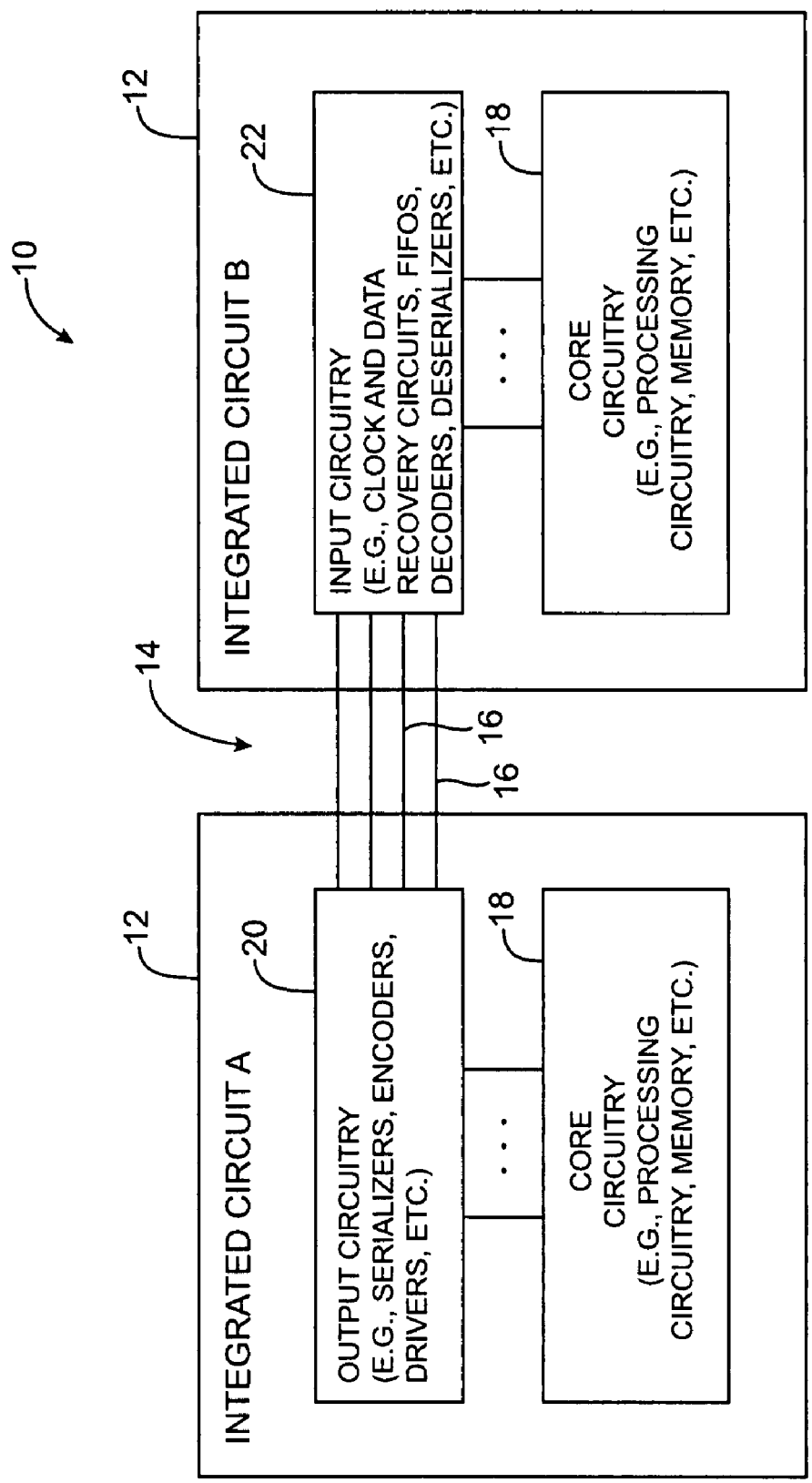
FIG. 1 is a diagram showing how two integrated circuits can communicate over a serial communications link made up of four parallel lanes using a serial communications protocol in accordance with the present invention.

Illustrative equipment 10 having two integrated circuits 12 that communicate over a serial communications link 14 is shown in FIG. 1. The integrated circuits 12 may be used in any suitable electronics equipment. For example, each integrated circuit 12 may be mounted on a different line card connected to a common system backplane in rack-mounted data processing or telecommunications equipment. As another example, integrated circuits 12 may be mounted on the same card or may be used in other types of electronic equipment. Each integrated circuit 12 may be, for example, a programmable logic device, a microprocessor, a digital signal processor, an application-specific integrated circuit (ASIC), etc.

Serial link 14 is generally a high-speed link having a data rate of many Gbps, although slower serial links may be used if desired. Link 14 is made up of a number of slower parallel serial links (lanes) 16. Each lane 16 may, for example, be formed from a differential signal path having a pair of conductors that support communications at a serial data rate of a few Gbps. Because each lane 16 may be connected and routed differently through equipment 10, the data streams on lanes 16 tend to become skewed with respect to each other (i.e., the data bits in one stream will be received at a time that is shifted ahead or behind the data bits of another stream). The different environments of each lane 16 will also generally cause the data streams on each lane to fall out of synchronization with each other. The clock associated with each lane 16 tends to be influenced by environmental factors during transmission. As a result, even if a common clock is used to transmit the signals over lanes 16, the clocks for lanes 16 will no longer be identical when they are received (i.e., the lanes 16 will no longer be synchronized). Deskewing and synchronization circuitry may be used to ensure that the data from the lanes is properly reconstructed at the receiving integrated circuit.

The local integrated circuit may insert idle characters to fill gaps in the data being transmitted over link 14 to the remote integrated circuit. This ensures that the link operates properly, even when no actual data is being transmitted in the gaps.

When separate clocks are used to operate the local and remote integrated circuits, the clock speeds of the local and remote integrated circuits will not match exactly.

To compensate for this mismatch in clock speeds, the local integrated circuit can insert clock tolerance compensation characters into the outgoing data stream. The clock tolerance compensation characters are discarded at the remote integrated circuit. Because this scheme provides extra ("dummy") characters in the data, a local clock that is faster than a remote clock will not overwhelm the remote circuit with too much data.

Sometimes the logic circuitry on a remote integrated circuit needs additional time to process incoming data. To prevent data from being transmitted too rapidly, the remote integrated circuit can issue flow control signals that direct the local circuit to temporarily stop transmitting data. This allows the remote integrated circuit to "catch up" to the local integrated circuit and prevents unnecessary data loss.

Integrated circuits that communicate over a serial communications link 14 can use a retry-on-error feature to help ensure the successful delivery of data to the remote integrated circuit. With this type of arrangement, each outgoing data packet from a local integrated circuit is labeled with a packet number (packet ID). The remote integrated circuit examines incoming packets to determine whether there has been a transmission problem (e.g., a bad packet or an out-of-order packet). Acknowledgement (ACK) and negative acknowledgement (NACK) signals may be transmitted from the remote integrated circuit to the local integrated circuit to inform the local integrated circuit whether or not packets have been successfully received. The local integrated circuit awaits confirmation from the remote integrated circuit that the transmitted data has been successfully received. If the data has been successfully received, the local integrated circuit can transmit additional data. If the data has not been successfully received, the local integrated circuit can resend the data.

In general, integrated circuits such as circuits 12 of FIG. 1 may have only transmitting circuitry, may have only receiving circuitry, or may have both transmitting and receiving circuitry. In the example of FIG. 1, integrated circuit A has core circuitry 18 that generates data. Output circuitry 20 may be used to serialize the data from core circuitry 18 and to encode the data to embed a clock in each data stream. Drivers in output circuitry 20 may be used to transmit the data from circuitry 18 to integrated circuit B over the multiple parallel lanes 16 of serial link 14.

At the receiving end of link 14, input circuitry 22 can be used to receive the transmitted data. The input circuitry 22 may include clock and data recovery circuits for extracting embedded clock signals, first-in-first-out (FIFO) buffer circuitry for deskewing and synchronizing the incoming data on the parallel lanes 16. Input circuitry 22 may also include decoding circuitry for decoding data that was encoded in output circuitry 20 and deserializers for converting the serial data from lanes 16 to parallel data. The resulting data is provided to core circuitry 18 on integrated circuit B. Core circuitry 18 may be any type of circuitry, including programmable logic, microprocessor circuitry, digital signal processor circuitry, processing circuitry that is part of an application-specific integrated circuit, memory circuitry, etc.

A serial communications protocol in accordance with the present invention preferably supports streaming data and packetized data transmission arrangements, high-priority data packet encapsulation and nesting, and data integrity protection. A user can also establish a desired number of user-defined data channels (data channel multiplexing).

Integrated circuits that are compliant with the serial communications protocol of the present invention can transmit data in either streaming mode or packet mode. In streaming mode, data is transmitted over link 14 without encapsulating the data in packets. This mode may be appropriate, for example, for transmitting large video files. In packet mode, pieces of data are encapsulated in packets. The packets have associated markers which can be used to enable functions such as retry-on-error functions. The streaming and packet modes are preferably optional. A logic designer that can select which of these modes to implement in a given design based on the type of data transmission tasks that need to be handled over the serial link 14.

In packet mode, different types of data may have different associated priority levels. For example, regular data may be transmitted in the form of regular data packets using a regular data port. A priority port may also be provided to allow more important data ("priority data") to be inserted within the regular data, without waiting for a break in transmission. With this type of scheme, priority packets are nested inside of regular data packets. Priority packets are encapsulated between priority packet markers, so that the priority data may be identified as priority data when received and placed on an appropriate priority port at the receiving integrated circuit. The data port and priority port features are preferably optional features.

Data integrity protection may be provided in circuits that are compliant with the serial communications protocol. Data integrity protection is preferably an optional and adjustable feature. This allows a logic designer to select a desired level of protection to implement on a given circuit. A logic designer may, for example, opt to include two-byte (16-bit) cyclic redundancy checking (CRC-16) in a given integrated circuit. Alternatively, the logic designer may chose to implement CRC-32 capabilities or may opt not to include any data integrity protection.

In accordance with the present invention, some of the features of the serial communications protocol (e.g., idle code insertion to fill gaps in transmitted data) are preferably mandatory. If a circuit does not have the ability to insert idle codes into gaps in the transmitted data, the circuit will not be compliant with the serial communications protocols. Optional features may or may not be incorporated into a given design depending on choices made by the logic designer.

With the present invention, data path features such as the streaming/packetized data feature, the priority data nesting feature, and the data integrity protection feature are optional and adjustable features. Because these data path features are optional, a logic designer can either include or not include support for these features while still satisfying the serial communications link protocol. A logic designer who is designing an integrated circuit and who decides to include an optional feature will benefit from the enhanced functionality the feature provides. If the logic designer decides not to include support for the optional feature in a given design, resources on the circuit that would otherwise need to be used for implementing the feature will be available to support other functions. For example, a microprocessor that does not include an optional serial communications feature can generally be constructed using less circuit real estate. As another example, forgoing an optional feature on a programmable logic device will free up programmable logic resources for use in supporting other functions on the device.

Although the present invention may be used in the context of any suitable integrated circuits that use serial communications (i.e., microprocessors, digital signal processors, application specific integrated circuits, etc.), the invention will sometimes be described in the context of programmable logic devices for clarity.

Figure 2:
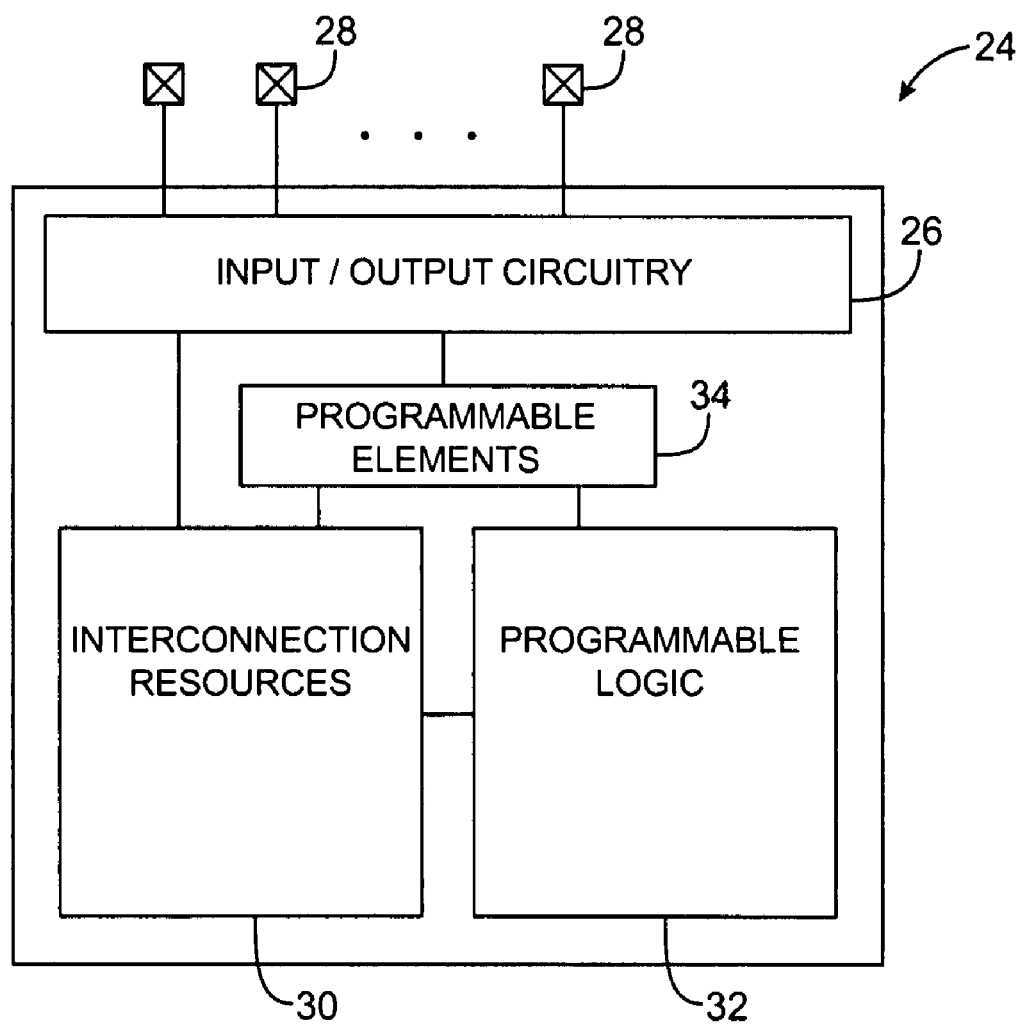
FIG. 2 is a diagram of an illustrative programmable logic device integrated circuit that may communicate using a serial communications protocol in accordance with the present invention.

An illustrative programmable logic device 24 in accordance with the present invention is shown in FIG. 2.

Programmable logic device 24 may have input/output circuitry 26 for driving signals off of device 24 and for receiving signals from other devices via input/output pins 28. Input/output circuitry 26 may include serial communications circuitry such as the output circuitry 20 and input circuitry 22 of FIG. 1. Certain pairs of pins 28 may be associated with respective pairs of differential signal conductors. Each pair of differential signals conductors may be associated with a respective lane 16 (FIG. 1) for supporting high-speed serial communications.

Interconnection resources 30 such as global and local vertical and horizontal conductive lines and busses may be used to route signals on device 24. Programmable logic 32 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers. Some of the logic of programmable logic device 24 is fixed. Programmable logic 32 includes components that may be configured so that device 24 performs a desired custom logic function.

Programmable logic device 24 may be based on any suitable programmable technology. With one suitable approach, configuration data (also called programming data) may be loaded into programmable elements 34 using pins 28 and input/output circuitry 26. The programmable elements (also sometimes called configuration bits or programmable function control elements) may each provide a static control output signal that controls the state of an associated logic component in programmable logic 32.

In a typical arrangement, the programmable elements 34 may be random-access memory (RAM) cells that are loaded from an external erasable-programmable read-only memory chip via certain pins 28 and appropriate portions of input/output circuitry 26. The loaded RAM cells 34 provide static control signals that are applied to the terminals (e.g., the gates) of circuit elements (e.g., metal-oxide-semiconductor transistors) in programmable logic 32 to control those elements (e.g., to turn certain transistors on or off) and thereby configure the logic in programmable logic 32. Circuit elements in input/output circuitry 26 and interconnection resources 30 are also generally configured by the RAM cell outputs as part of the programming process. The circuit elements that are configured in input/output circuitry 26, interconnection resources 30, and programmable logic 32 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 24. Other suitable programmable logic device technologies that may be used for device 24 include one-time programmable device arrangements such as those based on programmable logic elements made from fuses or antifuses, programmable logic devices in which elements 34 are formed from electrically-programmable read-only-memory (EPROM) or erasable-electrically-programmable read-only-memory (EEPROM) technology, or programmable logic devices with programmable elements made from magnetic storage elements, etc.

Regardless of the particular type of programmable element arrangement that is used for device 24, programmable elements are preferably provided with configuration data by a user (e.g., a logic designer). Once provided with configuration data, the programmable elements 34 selectively control (e.g., turn on and off) portions of the circuitry in the programmable logic device 24 and thereby customize its functions so that it will operate as desired.

The circuitry of device 24 may be organized using any suitable architecture. As an example, the logic of programmable logic device 24 may be organized in a series of rows and columns of larger programmable logic regions or areas each of which contains multiple smaller logic regions or areas (e.g., areas of logic based on look-up tables or macrocells). These logic resources may be interconnected by interconnection resources such as associated vertical and horizontal interconnection conductors. Interconnection conductors may include global conductive lines that span substantially all of device 24, fractional lines such as half-lines or quarter lines that span part of device 24, staggered lines of a particular length (e.g., sufficient to interconnect several logic areas), smaller local lines that interconnect small logic regions in a given portion of device 24, or any other suitable interconnection resource arrangement. If desired, the logic of device 24 may be arranged in more levels or layers in which multiple large areas are interconnected to form still larger portions of logic. Still other device arrangements may use logic that is not arranged in rows and columns. Portions of device 24 (e.g., in input/output circuitry 26 and elsewhere) may be hardwired. As an example, hardwired transmitter and receiver circuitry may be used to assist in serial communications functions. Hardwired digital signal processing circuitry (e.g., multipliers, adders, etc.) may also be used.

Figure 3:
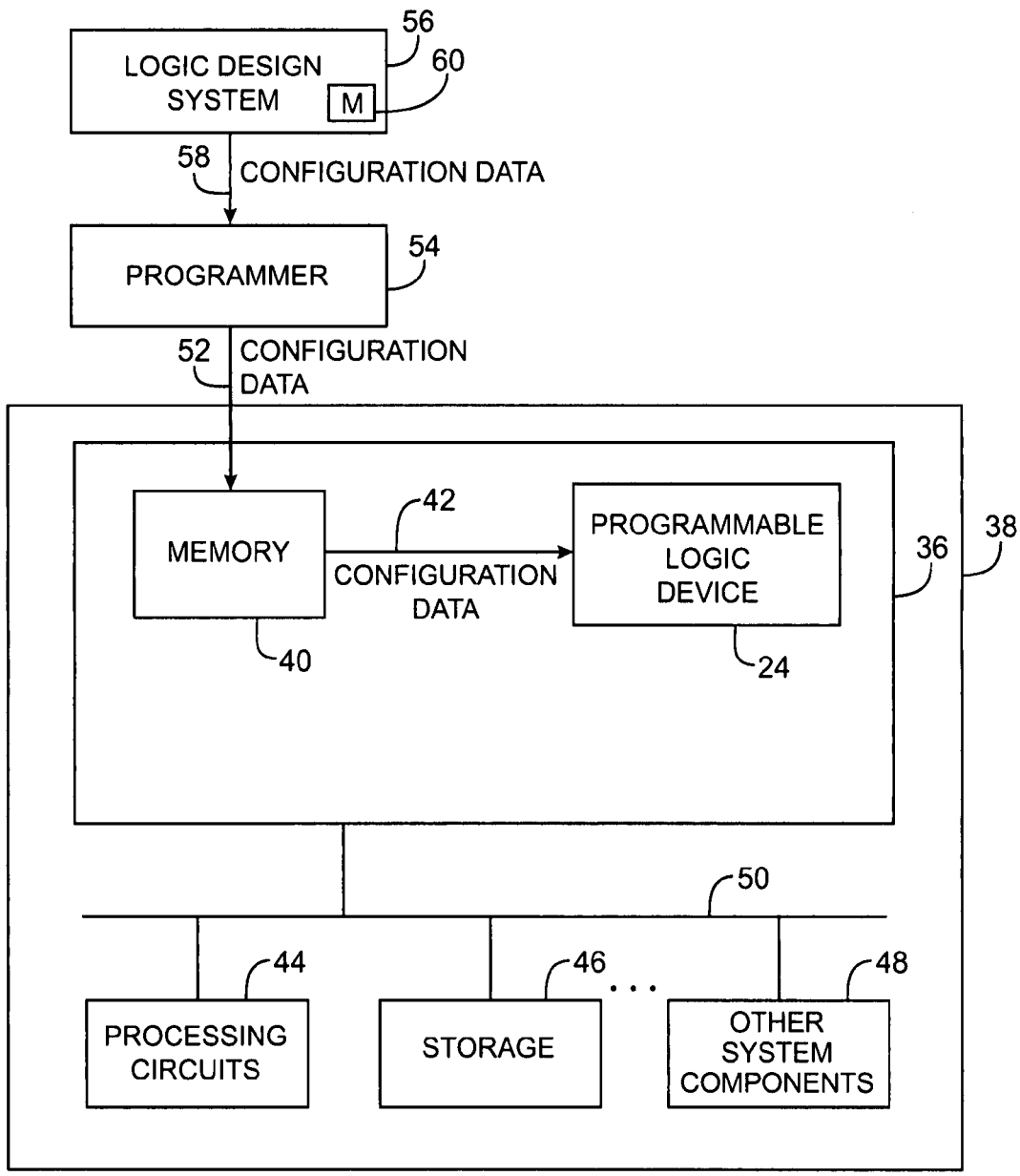
FIG. 3 is a diagram showing how configuration data may be generated for a programmable logic device integrated circuit in accordance with the present invention.

An illustrative system environment for a programmable logic device 24 is shown in FIG. 3. Programmable logic device 24 may be mounted on a board 36 in a system 38. In general, programmable logic device 24 may receive programming data from programming equipment or from any other suitable equipment or device. In the example of FIG. 3, programmable logic device 24 is the type of programmable logic device that receives configuration data from an associated memory chip 40. With this type of arrangement, memory chip 40 may, if desired, be mounted on the same board 36 as programmable logic device 24. The memory 40 may be an erasable-programmable read-only memory (EPROM) chip or other non-volatile memory device. When system 38 boots up (or at another suitable time), the configuration data for configuring the programmable logic device may be supplied to programmable logic device 24 from memory 40 via path 42. The configuration data that is supplied to the programmable logic device may be stored in the programmable logic device in configuration data cells (memory).

System 38 may include processing circuits 44, storage 46, and other system components 48 which may, if desired, contain circuitry that is compliant with the serial communications protocol of the invention. The components of system 38 may be located on one or more boards such as board 36 or other suitable mounting structures or housings and may be interconnected by busses and other electrical paths 50, which may include single-lane and multi-lane serial communications links.

Memory 40 may be supplied with the configuration data for device 24 over a path such as path 52. Memory 40 may, for example, receive the configuration data from a programmer 54 (e.g., an EPROM programmer) or other suitable equipment that stores this data in memory 40.

It can be a significant undertaking to design and implement a desired logic circuit in a programmable logic device and to perform other system design activities. Logic designers therefore generally want to use logic design systems based on computer-aided-design (CAD) tools to assist them in designing circuits and systems. A logic design system can help a logic designer design and test a complex circuit. When a design is complete, the logic design system may be used to generate configuration data for programming the appropriate programmable logic device or mask sets for creating a custom chip.

As shown in FIG. 3, the configuration data produced by a logic design system 56 may be provided to programmer 54 over a path such as path 58. The programmer 54 can program the configuration data into memory 40, so that memory 40 can later provide this configuration data to the programmable logic device 24 over path 42.

In arrangements of the type shown in FIG. 3, the programmable logic device 24 may have configuration data cells formed from memory cells such as static random-access memory cells. This is merely one illustrative arrangement for programming a programmable logic device 24. Any suitable arrangement for programming programmable logic device 24 may be used if desired. For example, programmable logic device 24 may be based on non-volatile configuration data cells such as erasable-programmable read-only memory (EPROM) cells. With this type of arrangement, device 24 can be configured by programming the configuration data into the EPROM cells on the device. Programmable logic device 24 may also be based on programmable elements such as fuses and antifuses or programmable elements based on other technologies (e.g., magnetic devices, etc.).

Regardless of the particular approach used for programming programmable logic device 24, programmable logic device 24 can be configured using configuration data produced by a logic design system 56.

Logic design system 56 includes storage 60. Software is used to implement the functions of system 56. The software may be stored on a computer-readable medium (storage) 60. Storage 60 may include computer memory chips, removable and fixed media such as hard disk drives, flash memory, compact discs (CDs), DVDs, and floppy diskettes, tapes, or any other suitable memory or storage device(s). When the software of system 56 is installed, storage 60 has instructions and data that cause the computing equipment in logic design system 56 to execute various methods (processes). When performing these processes, the computing equipment is configured to implement the functions of the logic design system 56.

Figure 4:
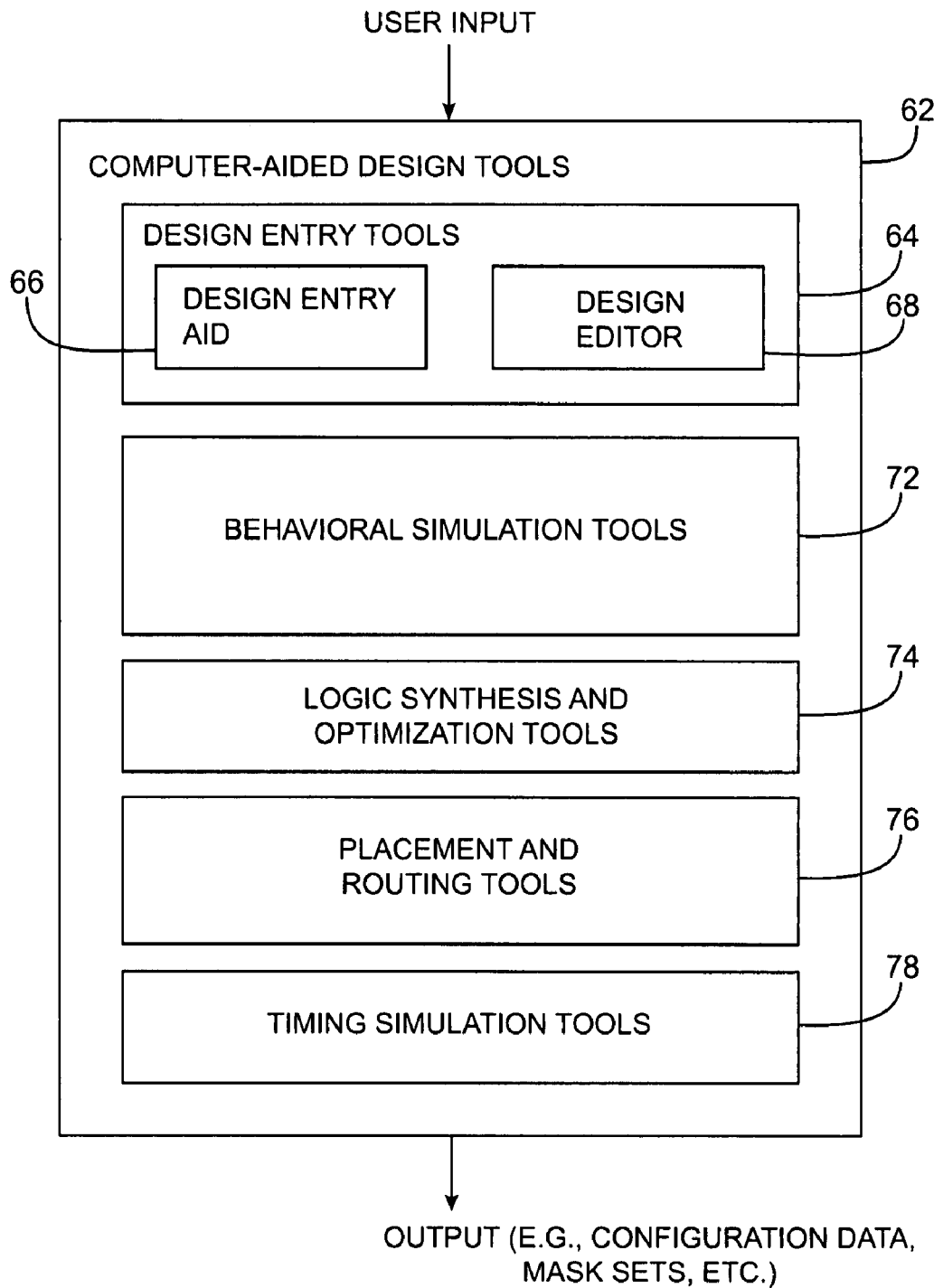
FIG. 4 is a diagram showing how computer-aided design tools may be used to create a logic design based on user input in accordance with the present invention.

Logic design system 56 may use computer-aided design tools such as tools 62 of FIG. 4. Tools such as tools 62 may be used to produce the configuration data for the programmable logic device 24 from a set of design specifications or other suitable input. Tools such as tools 62 can also be used to generate output in other suitable formats (e.g., as specifications for lithographic mask sets for semiconductor fabrication of a desired integrated circuit, etc.).

The design process typically starts with the formulation of logic circuit functional specifications. A logic designer can specify how a desired circuit should function using design entry tools 64. Design entry tools 64 may include tools such as design entry aid 66 and design editor 68. Design entry aids 66 help a logic designer locate a desired design from a library of existing logic designs and may provide computer-aided assistance to the logic designer for entering (specifying) the desired design. As an example, design entry aid 66 may be used to present screens of options for a user. In accordance with the present invention, these on-screen options may allow a user to select which optional data path feature the user desires to implement in a given logic design. The user may, for example, click on the on-screen options to select whether the circuit being designed should have streaming data capabilities or packetized data capabilities, whether the circuit should have a priority data port (e.g., to nest priority data within regular data), and which data integrity protection features the circuit should have (e.g., no protection, CRC-16 protection, or CRC-32 protection). Design editor 68 may be used to enter a design (e.g., by entering lines of hardware description language code), may be used to edit a design obtained from a library (e.g., using a design entry aid), or may assist a user in selecting and editing appropriate prepackaged code/designs.

Design entry tools 64 may be used to allow a logic designer to provide a desired logic design to logic system 62 using any suitable format. For example, design entry tools 64 may include tools that allow the logic designer to enter a logic design using truth tables. Truth tables can be specified using text files or timing diagrams and may be imported from a library. Truth table logic design entry may be used for a portion of a large circuit or for an entire circuit.

As another example, design entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design entry tools 64 may allow the logic designer to provide a logic design to the logic design system 56 using a hardware description language such as Verilog hardware description language (HDL) or Very High Speed Integrated Circuit Hardware Description Language (VHDL). The logic designer can enter the logic design by writing hardware description language code with editor 68. Blocks of code may be imported from libraries if desired.

After the design has been entered using design entry tools 64, behavioral simulation tools 72 may be used to simulate the functional performance of the design. If the functional performance of the design is incomplete or incorrect, the logic designer can make changes to the design using design entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.)

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family). As an example, if the logic design has serial communications circuitry that supports automatic lane polarity reversal, the logic synthesis and optimization tools 74 may decide to use an available hardwired automatic polarity detection and reversal circuit on the programmable logic device to perform the desired polarity reversal function. Tools 74 may, alternatively, implement the polarity reversal functions using a "soft" design—i.e., using mostly or entirely programmable logic resources.

Tools 74 can optimize the design by proper selection of the available hardware to implement different logic functions in the logic design. Often tradeoffs are made because multiple logic functions are competing for limited resources.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

After an implementation of the desired logic design in the programmable logic device has been generated using placement and routing tools 76, the implementation of the design may be tested using simulation tools such as timing simulation tools 78. Timing simulation tools may, for example, predict the delay times that are associated with certain signal paths through the device. The timing simulation tools may be used to verify that the particular implementation of the design that is being tested does not contain signal paths with delays that are outside of the limits imposed during the design phase. For example, the timing simulation tools may be used to ensure that the slowest data paths are fast enough that the minimum desired clock speed and minimum signal path delay constraints are satisfied. The timing simulation tools may also examine the design for potential race conditions or other conditions that affect device performance.

After satisfactory testing using tools 78, the CAD tools 62 can produce the configuration data for the programmable logic device or can generate other suitable output data (e.g., the specifications for a lithographic mask set for fabricating an integrated circuit incorporating the logic design). Depending on the type of programmable logic device being used (e.g., a device based on non-volatile memory, a device based on volatile memory, a device based on fuses or antifuses, etc.), configuration data may be programmed into the programmable logic device directly or may be provided to a memory device that later (e.g., upon power-up) loads the configuration data into the programmable logic device to program the device.

To assist a logic designer in choosing among optional data path serial communications link functions such as support for streaming or packetized data, priority packet encapsulation and nesting, and data integrity protection, computer-aided design tools 62 (e.g., design entry tools 64) can provide the logic designer with on-screen options with which the logic designer can make feature choices. As an example, tools 64 may present a user with a screen containing clickable items for the user to select. The user may click on a "regular data port" option when the user desires to send data using a regular data port. If the regular data port option is selected, the user may be allowed to select between streaming and packetized data mode delivery options. The user may click on a "priority data port" option when the user desires to send a data using a priority data port. If the priority data port option is selected, the user may be presented with a retry-on-error option that can be selected to implement retry-on-error functions. Options relating to data integrity protection (e.g., whether or not to protect data, the level of CRC protection desired, and the direction to protect—incoming to the receiver, outgoing from the transmitter, or both), may also be presented to the user. The on-screen options may include buttons, drop-down menus, fillable boxes, tabs, or any other suitable graphical user interface options.

With the serial communications protocol of the present invention, data path functions such as streaming/packetized data function, priority port data encapsulation and nesting functions, and data integrity protection functions are optional serial communications features. If the user would like the circuit design to handle streaming data (as an example), the user can select an option with tools 62 that will cause tools 62 to include streaming data functionality into the circuit design. Similarly, the functionality for packetized data, priority data nesting, data integrity protection, clock tolerance compensation operations, retry-on-error operations, and link initialization operations can be selectively incorporated into the circuit design by appropriate selection of the on-screen options that are presented by the design entry tools 64.

By using on-screen options or by otherwise providing the user with an opportunity to choose which optional features to include in a given integrated circuit design, the computer-aided design tools 62 (e.g., the design entry tools such as design entry aid 66 and/or design editor 68) allow the user to increase functionality (at the expense of increased resource consumption) or allow the user to reduce resource consumption (at the expense of reduced functionality) while still producing a protocol-compliant design.

When the user has finished selecting the desired options for the design, the user may click on a "finish" option. The computer-aided design tools 62 may then be used to complete the design process.

If, for example, the logic designer is designing circuitry to be implemented in a programmable logic device, the computer-aided design tools 62 may be used to complete the design process by producing configuration data for programming a programmable logic device. The configuration data that is created will reflect the inclusion of the desired optional features that have been selected by the user. When loaded into a programmable logic device, the configuration data will configure the programmable logic on the device to implement the desired features while simultaneously configuring the programmable logic on the device so that resources are conserved by not implementing the undesired features. If desired, all of the optional data path features and other serial link communications features may be included or all of these optional features may be omitted.

If the logic designer is designing circuitry for an integrated circuit such as a microprocessor, digital signal processor, or other such circuit (including programmable logic devices) whose serial communications circuitry is exclusively or at least partially hardwired, the output of the computer-aided design tools 62 may be used to complete the design process by producing specifications for a lithographic mask set for fabricating the integrated circuit. The circuitry produced using the mask set will include the desired optional features (and will consume associated resources) and will not include the undesired features (while conserving associated resources).

Figure 5:
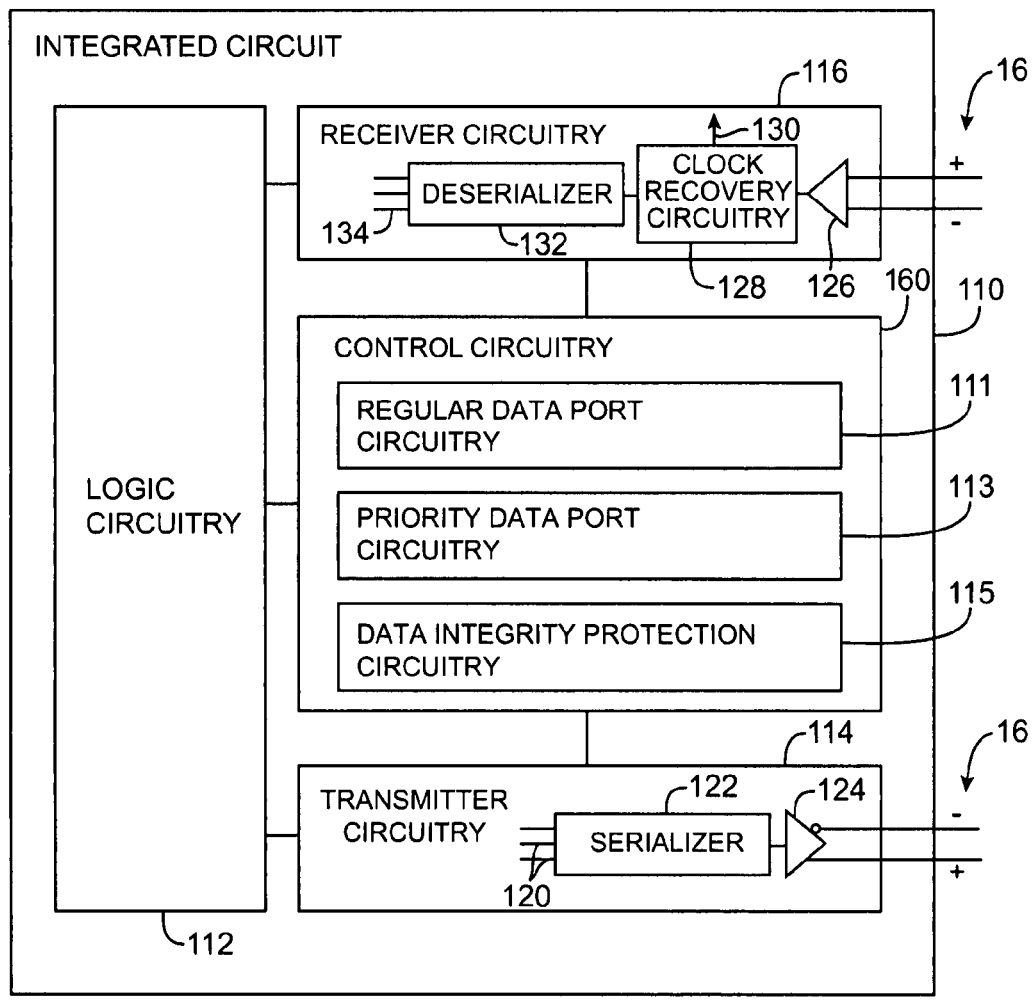
FIG. 5 is a diagram of an illustrative integrated circuit with serial communications circuitry constructed in accordance with the present invention.

A diagram of an illustrative integrated circuit 110 that includes circuitry suitable for performing the optional data path functions such as the streaming/packetized data mode feature (regular data port circuitry 111), the priority packet nesting feature (priority data port circuitry 113), and the variable-level data integrity protection feature (data integrity protection circuitry 115) is shown in FIG. 5. Integrated circuit 110 may be a programmable logic device, microprocessor, digital signal processor, application specific integrated circuit, or other suitable integrated circuit. If circuit 110 is a programmable logic device, logic circuitry 112 on integrated circuit 110 will typically include programmable logic such as programmable logic 32 of FIG. 2 and hardwired logic. For other types of integrated circuit, logic circuitry 112 is generally hardwired digital logic circuitry.

Integrated circuit 110 may transmit digital data signals from logic circuitry 112 to other integrated circuits using transmitter circuitry 114. Receiver circuitry 116 may be used to receive digital data signals for logic circuitry 112 from other integrated circuits.

Transmitter circuitry 114 and receiver circuitry 116 are controlled by control circuitry 160. The circuitry of control circuitry 160 (i.e., circuitry 111, 113, and 115) and circuitry 114 and 116 need not be mutually exclusive. For example, priority data port operations may be performed using priority data port circuitry 113 and circuitry in transmitter circuitry 114 and receiver circuitry 116. As another example, data integrity protection circuitry 115, regular data port circuitry 111, and circuitry in transmitter 114 and receiver 116 may share on-chip resources. These are merely illustrative examples. In general, the circuitry used to implement the desired data path and transmitter and receiver functions of circuit 110 may be implemented using any suitable scheme.

Transmitter circuitry 114 receives signals from logic circuitry 112. Parallel inputs 120 may be used to provide data from logic circuitry 112 to serializer 122. Serializer 122 may serialize parallel data on inputs 120 so that the data can be transmitted over a serial link having one or more lanes. A differential driver 124 may drive serial data from the output of serializer 122 onto two parallel differential signal lines in lane 16. In the example of FIG. 5, there is only a single lane 16 associated with transmitter circuitry 114. This is merely illustrative. In general there may be one or more parallel lanes in a given serial link 14, as shown in FIG. 1.

Receiver circuitry 116 of FIG. 5 has a differential input driver 126 that receives data from another integrated circuit over a lane 16. Only a single lane 16 is associated with the receiver circuitry 116 in the example of FIG. 5. This is merely illustrative. Multiple parallel lanes in a serial link may be associated with receiver circuitry 116 if desired.

The differential data at the two inputs of differential input driver 126 of receiver circuitry 116 is provided to clock-and-data recovery (CDR) circuitry 128. Clock-and-data recovery circuitry 128 extracts embedded clock information from the incoming signal and provides the extracted clock signals at line 130. Recovered serial data is provided to deserializer 132. Deserializer 132 deserializes the data provided by clock recovery circuitry 128 and provides corresponding parallel data at output lines 134. The parallel data from output lines 134 may be distributed to logic circuitry 112.

The receiver circuitry 116, control circuitry 160, and the transmitter circuitry 114 are used to support serial communications in accordance with the serial communications protocol of the present invention. In a given integrated circuit, the amount and type of circuit resources present in circuitry 114, 116, and 160 depends on which optional serial communications features were included by the logic designer. For example, during the design process, the logic designer may have clicked on a on a "streaming data" data mode option that was presented by tools 64 (FIG. 4). In this case, when the integrated circuit is implemented as a chip, the chip will have control circuitry 160 that includes regular data port circuitry 111 that is capable of handling streaming data. If, however, the logic designer clicked on a "packetized data" data mode option presented by tools 64, the chip will have control circuitry 160 that includes circuitry for handling packetized data rather than streaming data.

Similarly, the logic designer may have clicked on a CRC-16 data integrity protection feature presented by tools 64 during the design process. In this case, when the integrated circuit is implemented as a chip, the chip will have control circuitry 160 that includes circuitry for performing CRC-16 operations. If, however, the logic designer clicked on an option presented by tools 64 that indicates that there should be no data integrity protection, the chip will have control circuitry 160 that does not include circuitry for CRC operations.

The situation is similar for other options. For example, if the user chose to include a regular data port and a priority data port, the circuit will be implemented such that control circuitry 160 includes circuitry that nests priority packets within regular data packets as needed. If the user chose not to include these functions in the design, the circuit will be implemented such that control circuitry 160 does not include the undesired functions.

These different implementations—i.e., the chips that have various configurations of circuitry 111, 113, and 115—are compliant with the serial communications protocol of the present invention. The implementations with fewer data path features will consume fewer logic resources on the integrated circuit and may therefore be less complex and less expensive. The implementations with relatively more (or all) of the data path features will have added functionality.

Figure 6:
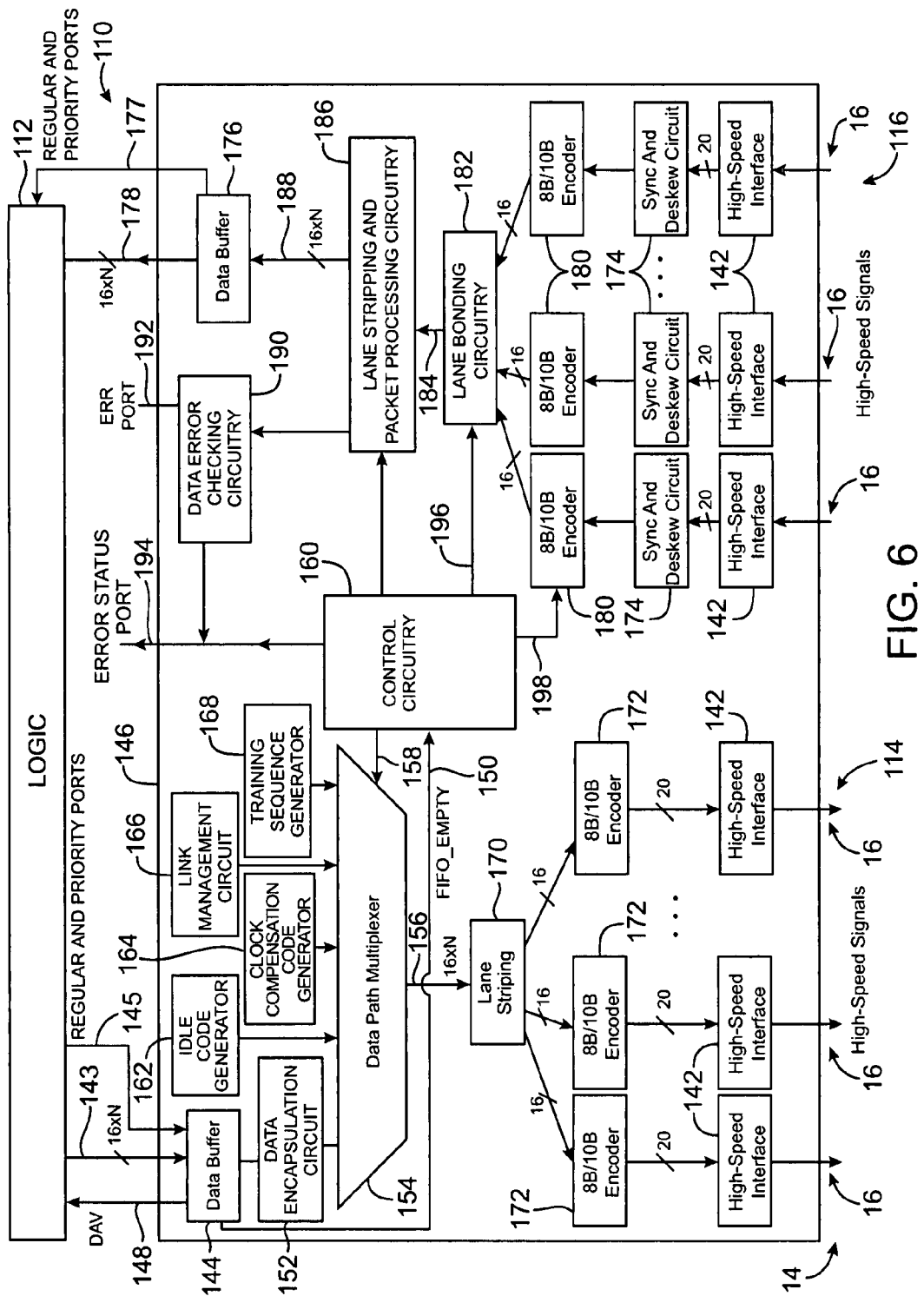
FIG. 6 is a more detailed diagram of an illustrative integrated circuit with serial communications circuitry constructed in accordance with the present invention.

An illustrative integrated circuit 110 which may be used to transmit and receive serial data in accordance with the serial communications protocol of the present invention is shown in FIG. 6. Integrated circuit 110 of FIG. 6 has input/output circuitry 146. Input/output circuitry 146 may, for example, be input/output circuitry such as circuitry 26 of FIG. 2 for integrated circuits 110 that are programmable logic devices.

Input/output circuitry 146 of integrated circuit 110 includes serial communications circuitry. For example, input/output circuitry 146 has transmitter circuitry 114 for transmitting data over one or more lanes 16 of serial link 14. Integrated circuit 110 also has receiver circuitry 116 for receiving serial communications from another integrated circuit over one or more lanes 16. High-speed interface circuitry 142 in the transmitter circuitry 114 includes serializer and driver circuitry such as serializer 122 and driver 124 of FIG. 5. High-speed interface circuitry 142 in the receiver circuitry 116 may include components such as the differential input driver 126, clock-and-data recovery circuitry 128, and deserializer circuitry 132 of FIG. 5.

Each lane 16 has two differential signal lines—a positive (+) line and a negative (−) line (shown in more detail in FIG. 5). To support two-way traffic, link 14 has both outgoing pairs of signal lines connected to transmitter circuitry 114 and incoming pairs of signal lines connected to receiver circuitry 116. The number of lanes 16 in link 14 is given by the integer N in FIG. 6. The value of N may be 1 (in a single-lane link) or may be more than 1. As an example, in a four-lane serial link 14 having four outgoing pairs of differential signal lines and having four incoming pairs of differential signals lines, the value of N is 4.

Data to be transmitted over link 14 from integrated circuit 110 to another integrated circuit is passed from logic 112 to data buffer 144 over paths such as path 143. In the example of FIG. 6, data words have 16 bits and the size of path 143 is N×16, where N is the number of lanes in link 14 (as an example).

Buffer 144 may be used to help provide an interface between logic 112 and input-output circuitry 146. When no more data can be accepted from logic 112 because the buffer is full (e.g., because first-in-first out (FIFO) circuitry in buffer 144 is full), the DAV signal on line 148 may be asserted. Logic 112 may monitor the status of DAV to determine whether or not buffer 144 is ready to accept data. When the FIFO (or other suitable buffer circuitry) in buffer 144 is empty, the FIFO_EMPTY signal on line 150 may be asserted. When control circuitry 160 receives a FIFO_EMPTY signal from data buffer 144, the control circuitry 160 may insert idle codes into the outgoing data.

If desired, data from data buffer 144 may be encapsulated as packets using data encapsulation circuit 152. During the encapsulation process, a data payload may be encapsulated between start-of-packet (SOP) and end-of-packet (EOP) markers.

Regular and priority data can be implemented using data buffer 144. Data buffer 144 may have associated regular and priority data and address ports, shown schematically by line 145 in FIG. 6.

A data path multiplexer 154 or other suitable signal routing circuitry may be used to route the data to be transmitted to the final stages of the transmitter. Data path multiplexer 154 may have multiple inputs and a single output 156.

Control circuitry 160 may control the operation of input/output circuitry 146. For example, control circuitry 160 may control data path multiplexer 154 via control path 158. By controlling which control signals are applied to data path multiplexer 154 via control path 158, the control circuitry 160 can select which of the data path multiplexer's inputs is connected to the output 156. When, for example, it is desired to transmit data from data buffer 144 over link 14, the control circuitry 160 can direct the multiplexer 154 to connect the input connected to data encapsulation circuit 152 to output 156.

Data on the other multiplexer inputs may be routed to output 156 as appropriate. Data from idle code generator 162 may be routed through multiplexer 154 when it is desired to transmit idle codes. Clock tolerance compensation sequences (codes) from clock compensation code generator 164 may be inserted into the transmitted data to compensate for mismatches between the clock of integrated circuit 110 and the clock of the integrated circuit to which data is being transmitted over link 14. The clock compensation codes may be discarded at the receiver of the receiving integrated circuit to accommodate the clock mismatch.

Link management circuit 166 may be used to handle the generation of link management instructions (packets) for flow control operations, retry-on-error operations, etc. Multiplexer 154 may be used to send these link management instructions into the data stream when appropriate.

Training sequence generator 168 may be used to generate training sequences that are used during link initialization. Training sequence generator 168 may, for example, generate a first training sequence called TS1 and a second training sequence called TS2, which are used at various stages of the link initialization process. The training sequences TS1 and TS2 include handshaking information that is used to bring up link 14 during link initialization. Other types of training sequence information can be generated by generator 168 if desired.

Lane striping circuitry 170 may be used to distribute the 16×N bits of parallel data on output 156 among the N lanes 16. Two bytes of data may be distributed among the lanes at a time, which ensures that transmitted data is word aligned. Encoders 172 (e.g., 8B/10B encoders or other suitable encoders) may be used to convert 8-bit bytes of data into corresponding 10-bit coded words. The coded words supplied at the outputs of the encoders have the same information content as the data provided to their inputs. The additional bits in the coded words ensure that there are a sufficient number of high-to-low and low-to-high transitions in the data to allow successful clock extraction at the receiver. At the receiver, circuitry such as clock-and-data recovery circuitry 128 of FIG. 5 can be used to extract the embedded clock signal from the encoded data.

After passing through encoders 172, the outgoing data may be transmitted across link 14 on respective lanes 16 using the serializer and driver circuitry of high-speed interfaces 142. Typically the data being transmitted over link 14 is high-speed data (e.g., data transmitted at data rates of 100 s of Mbps or Gbps).

Incoming data from the integrated circuit at the other end of link 14 may be received by the input drivers, clock-and-data recovery circuitry, and deserializers of the high-speed interface circuitry 142 in receiver circuitry 116. When there is more than one lane 16 of incoming data, synchronization and deskewing circuitry 174 may be used to synchronize and deskew the incoming data so that it can be successfully merged into a single stream of data suitable for transmission to logic 112 via data buffer 176 and path 178. Data buffer 176 may be used to implement a regular data port and a priority data port and may have associated data and address ports 177 for regular data and priority data, which may be monitored by logic 112.

Decoders 180 may be used to decode incoming data (e.g., from 10-bit codes to 8-bit data bytes). Lane bonding circuitry 182 may be used to merge multiple lanes of data into a single data path 184. Lane stripping and packet processing circuitry 186 may be used to remove data encapsulation information from the incoming data (e.g., to remove SOP and EOP characters). Stripped data may be provided at output 188.

Data error checking circuitry 190 may be used to check received data for errors (e.g., errors such as cyclic redundancy check (CRC) errors, 8B/10B errors or other decoding errors, etc.). If data error checking circuitry 190 detects an error, a suitable error signal may be generated. For example, an error signal may be asserted on ERR port 192 when an error is detected during retry-on-error operations. If a catastrophic error is detected, a catastrophic error signal may be produced by data error checking circuitry 190 and placed on error status port 194. Control circuitry 160 can also generate catastrophic error signals for port 194 when appropriate. Ports such as port 192 and 194 may be monitored by logic 112.

In general, circuits constructed in accordance with the serial communications protocol of the present invention may classify errors as catastrophic errors, link errors, data errors, or marked bad errors. A catastrophic error is an unrecoverable error that arises during initialization (i.e., if a lane has the wrong polarity and automatic polarity reversal has not been implemented). A link error results when the seriousness of the error indicates that the link is not able to transmit or receive data, which triggers the initialization process. A data error results in a packet being marked as bad before it is forwarded to logic 112 or a request for retransmission from the remote circuit. Most errors originate from protocol violations at the link layer or bit errors at the physical layer. Physical layer bit errors may involve 8B/10B coding violations and may affect one or multiple lanes. Bit errors at the physical layer may result in link layer protocol errors or cyclic redundancy check (CRC) errors. Severe physical lane errors or bursts of errors may result in multiple coding violations, loss of 8B/10B code alignment, or loss of lane alignment.

The way in which the circuitry of FIG. 6 is implemented depends on which optional serial communications link features the logic designer (user) chose when designing the integrated circuit 110 using tools 62. For example, if the user chose to include the flow control feature, the resulting integrated circuit 110 will have flow control capabilities. The optional serial communications link features can be implemented by proper configuration of input/output circuitry 146 (i.e., transmitter circuitry 114, control circuitry 160, and receiver circuitry 116).

Operations such as those involved in handling streaming data and packetized data, priority packet encapsulation and nesting, data integrity protection, link initialization, clock tolerance compensation, flow control, and retry-on-error operations are generally two-sided processes. For clarity, such operations are often described herein in the context of a "local" integrated circuit that communicates over link 14 with a "remote" integrated circuit. The local integrated circuit's transmitting circuitry is often transmitting information to the receiving circuitry of the remote circuit while the transmitting circuitry of the remote circuit is transmitting information to the receiving circuitry of the local circuit. To operate a bidirectional serial link 14 between the local and remote circuits, both the local and remote circuits must transmit and receive signals.

Serial communications circuitry constructed in accordance with the serial communications protocol of the present invention may insert idle characters into gaps in the transmitted data. The idle code feature is preferably mandatory (not optional).

If gaps were permitted to remain in the transmitted data, there would be potentially large periods of time during which no signals would be transmitted across link 14. This would disrupt the link, because the phase-locked-loop or delay-locked loop circuitry in the clock-and-date recovery circuit of the receiver would lose frequency lock on the data. As a result, control circuitry 160 preferably uses idle code generator 162 and data path multiplexer 154 (FIG. 6) to insert idle codes into gaps in the transmitted data. The idle codes serve as a type of "dummy data" that keeps the link 14 active even when no actual data needs to be transmitted.

Any suitable characters may be used as idle codes. For example, the idle code generator 162 may produce a preferably randomized sequence of /R/ and /K/ characters at its output with alignment characters /A/ inserted randomly every 16-31 clock cycles. This sequence of idle characters may be used to fill gaps (e.g., by merging these characters into the data path using data path multiplexer 154 of FIG. 6). The randomness of the /R/s, /K/s, and the /A/s reduces electromagnetic interference (EMI) (i.e., radiated noise) on the lines in link 14. When the idle characters are received at the remote end of the link 14, they may be discarded (ignored). The /A/s are used by the deskewing circuitry in the remote receiver to align lanes 16.

The use of idle characters helps ensure that data gaps do not affect the integrity of the link. The use of idle characters is preferably mandatory in integrated circuits that are compliant with the serial communications protocol of the present invention. Other features are optional.

For example, the inclusion of clock tolerance compensation circuitry such as clock compensation code generator 164 in integrated circuit 110 is optional. Circuits can be designed using tools 62 of FIG. 4 that either include or do not include circuitry for compensating for mismatches between local and remote clocks. Both types of circuits will still be compliant with the serial communications protocol of the present invention and will be able to communicate under the proper circumstances.

Clock tolerance compensation circuitry is generally needed when a local integrated circuit and remote integrated circuit do not share a common clock, because there will be a mismatch between clocks that are nominally identical. The clock compensation circuitry can be omitted to save resources when a common clock is available. When clock tolerance compensation circuitry is used, clock tolerance compensation codes are inserted into the transmitted data at regular intervals. At the receiver, the inserted codes are discarded. When the remote clock is slower than the local clock, the reception and discarding of the clock compensation codes prevents data from being lost. If the clock compensation codes are not inserted in this type of situation, the faster transmitter may overwhelm the receiver with data.

Another optional serial communications link feature in the serial communications protocol relates to retry-on-error operations. With a retry-on-error scheme, the remote integrated circuit actively acknowledges successfully received data (packets). The local integrated circuit retains transmitted data temporarily in a circular buffer. If the transmitted data is not received properly, it can be retransmitted. The retry-on-error feature, when implemented, therefore helps to ensure successful transmission of data between the local and remote integrated circuits.

When the retry-on-error feature is implemented, data buffer 144 generally includes first-in-first-out (FIFO) buffer circuitry (typically multiple FIFOs in parallel) and circular buffer circuitry (typically multiple circular buffers in parallel). Data from logic 112 is initially placed in the FIFO. The circular buffer circuitry may be loaded from FIFO. When loaded, the oldest data in the circular buffer is overwritten with the new data in a circular fashion.

Data in the circular buffer is transmitted from the local integrated circuit to the remote integrated circuit over link 14. Data is retained in the circular buffer until its reception is acknowledged by the remote integrated circuit. The retained data is available to be retransmitted to the remote integrated circuit in the event of a transmission error.

Each transmitted packet is labeled with a packet number. At the remote integrated circuit, packets are checked. If a bad packet is received or if a packet is received out of order, the remote integrated circuit may ask the local integrated circuit to retransmit the packet. Properly received packets are acknowledged so that the local integrated circuit can load new data into the circular buffer for transmission.

A regular data port and a priority data port are available for implementation by a user. With the regular data port, the user may either stream data or send data as packets. Retry-on-error functionality may be provided by using the priority data port. Use of the priority data port also makes it possible to nest higher-priority data (priority data from the priority port) into regular data (from the regular data port). Data integrity protection is available for users of both the regular data port and the priority data port.

Multiple levels of nesting are permitted. For example, a link management packet (from link management circuit 166 of FIG. 6) may be nested within a priority packet, which in turn is nested within a regular data packet. Clock tolerance compensation sequences have even higher priority than link management packets, so when clock tolerance compensation is implemented, clock tolerance compensation codes can be nested within link management packets.

Figure 7:
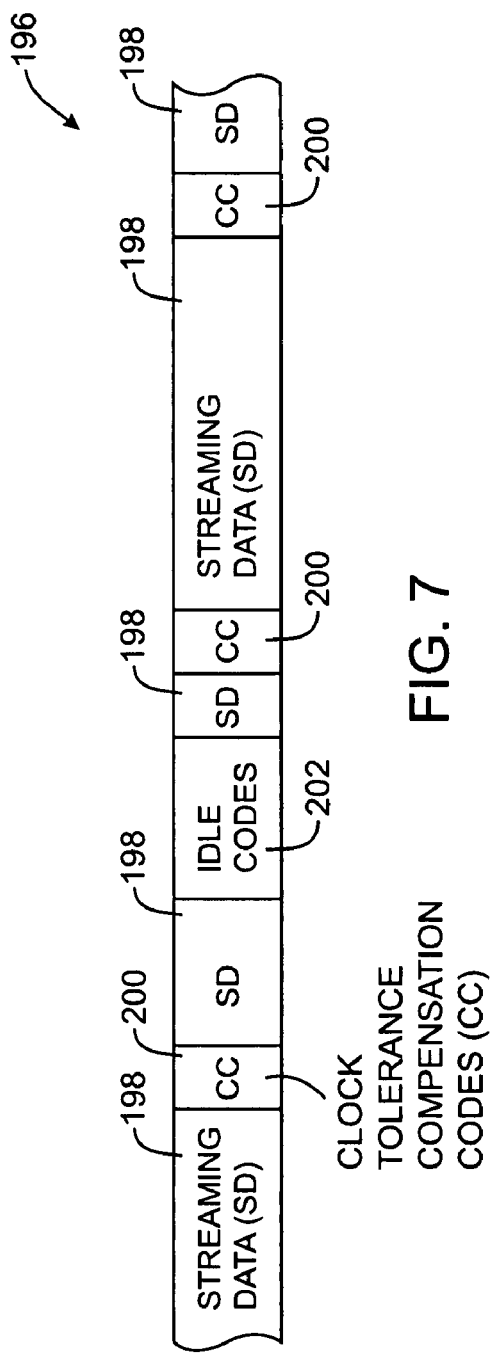
FIG. 7 is a diagram showing how serial communications circuitry for an integrated circuit may used to support streaming data in accordance with the present invention.

Computer aided design tools 62 may be used to provide a user with an opportunity to select desired data port and priority port features. When a user chooses to use a streaming data mode (which is available using the data port), the resulting circuit 110 will communicate over link 14 using streaming data of the type shown in FIG. 7. As shown in FIG. 7, a typical data stream 196 includes streaming data 198 intermixed with clock tolerance compensation codes 200 (when the clock tolerance compensation feature has been implemented) and idle codes 202. Idle codes 202 may be inserted when there is a gap in the data to be transmitted (i.e., data buffer 144 is empty) or when the local control circuitry 160 is temporarily pausing the transmission of data due to reception of a pause signal or other suitable flow control signal from the remote circuit. The streaming data mode may be used in environments in which the addition of the overhead associated with packet encapsulation is not desired.

Figure 8:
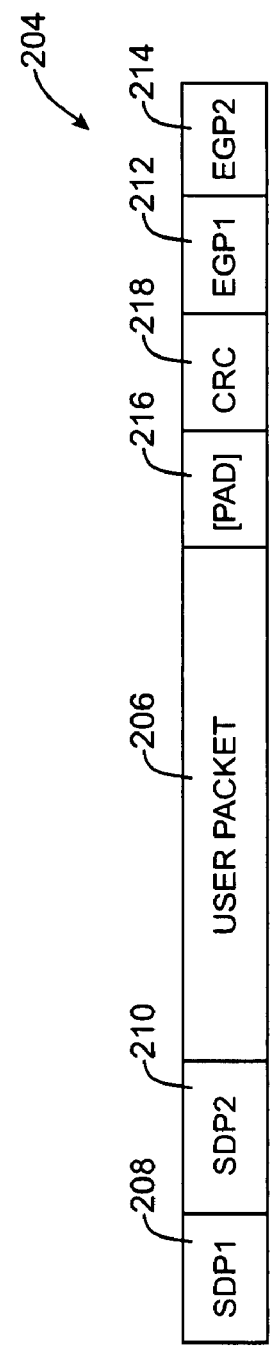
FIG. 8 is a diagram showing how serial communications circuitry for an integrated circuit may used to support packetized data in accordance with the present invention.

Data can also be transmitted in packets, as shown by data 204 in FIG. 8. Packetized data may be transmitted using either the data port or the priority port. In the example of FIG. 8, the transmitted packetized data 204 is being transmitted through the data port. With this arrangement, user data 206 from buffer 144 is encapsulated as a packet using data encapsulation circuit 152 (FIG. 6). During encapsulation of data 206 a pad character 216 is added to data 206 if data 206 has an odd length. Pad character 216 is not required when data 206 has an even length. If cyclic redundancy checking has been implemented, CRC redundancy information 218 may be added to the data following pad 216. Start-of-packet (SOP) marker codes 208 and 210 and end-of-packet (EOP) marker codes 212 and 214 are placed at the beginning and end of the data 206 to form a completed packet. The packet 204 is then transmitted over link 14, where the SOP and EOP information is stripped, the pad byte is discarded, and error checking operations are performed using CRC information 218.

Figure 9:
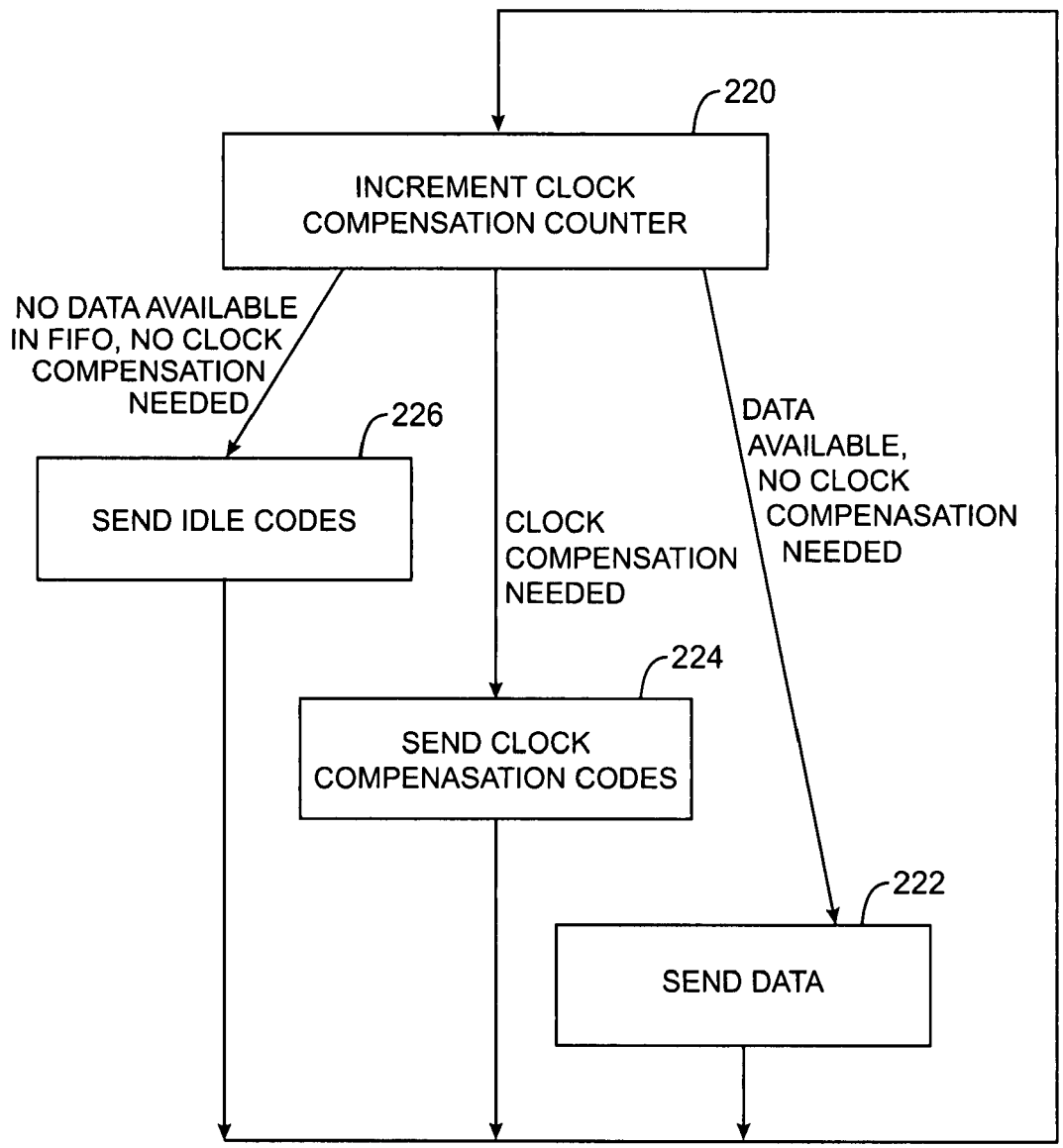
FIG. 9 is a flow chart of illustrative steps involved in transmitting streaming data over a serial communications link in accordance with the present invention.

Illustrative steps involved in transmitting data in streaming data mode are shown in FIG. 9. At step 220, the input/output circuitry 146 on circuit 110 increments a clock compensation counter (if clock tolerance compensation has been implemented). If data is available in data buffer 144 for transmission and no clock tolerance compensation characters are currently needed, the circuit can send the data to be transmitted over link 14 (step 222). The clock compensation counter can then be incremented again at step 220.

When it is time to insert a clock tolerance compensation code, clock compensation code generator 164 and data path multiplexer 154 may be used to insert clock compensation codes into the data stream (step 224). After clock compensation code insertion, the clock compensation counter can be incremented at step 220. Clock tolerance compensation codes take precedence over data. If the clock tolerance compensation feature has not been implemented on a given circuit, step 224 is omitted.

If no data is available in data buffer 144 to be transmitted and if the state of the clock compensation counter indicates that no clock compensation characters are currently needed, idle codes may be transmitted to maintain the link (step 226).

Figure 10:
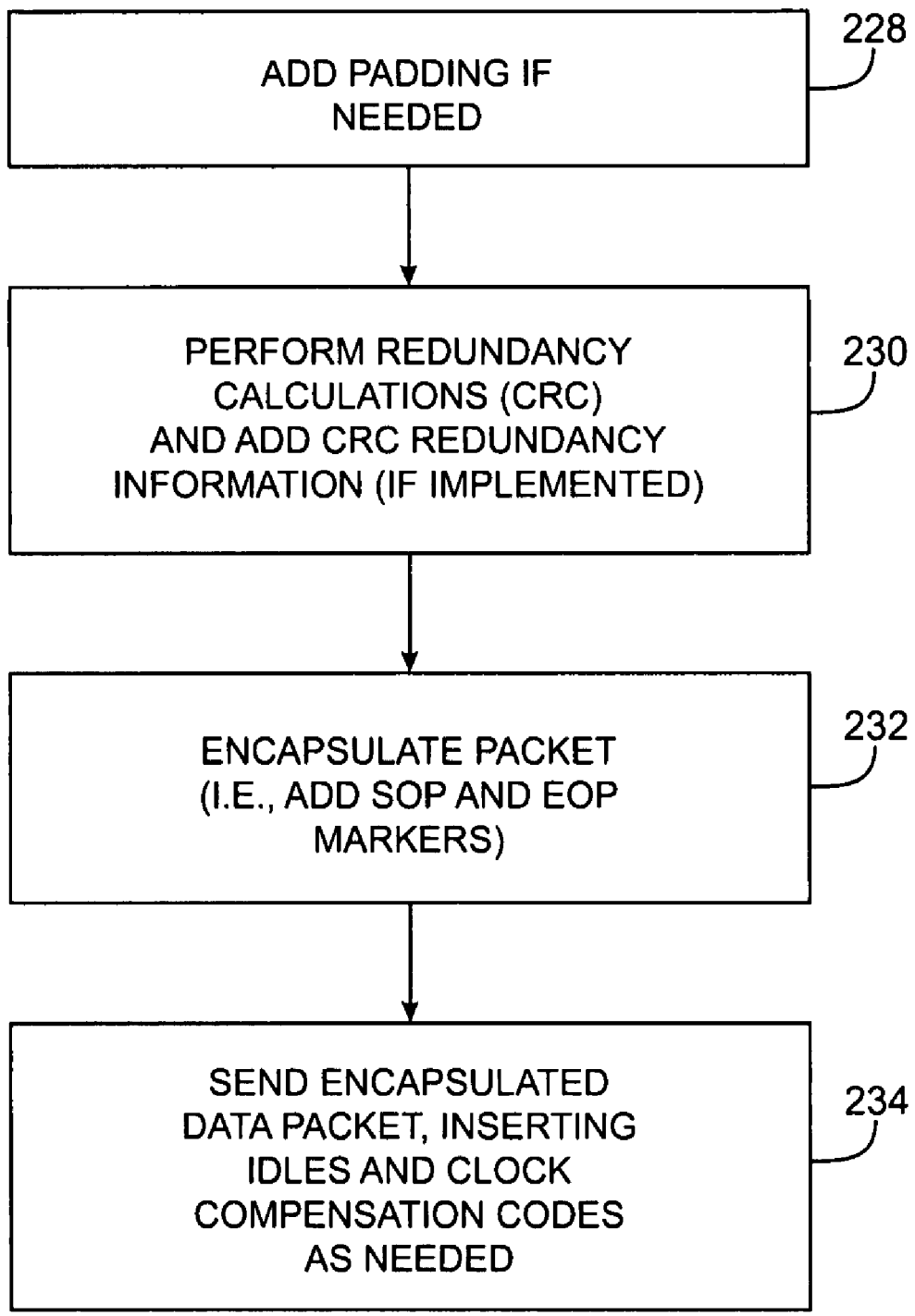
FIG. 10 is a flow chart of illustrative steps involved in transmitting packetized data over a serial communications link in accordance with the present invention.

When data is sent as packets, the steps of FIG. 10 can be used. Initially, padding is added (if needed) to make the user data 206 (FIG. 8) an even length of bytes long (step 228) (i.e., to maintain the word boundary). After padding, redundancy calculations are performed at step 230 (if data integrity protection has been implemented). For example, if the user chose to implement data integrity protection using a CRC-16 (16-bit) scheme, 16 bits of CRC redundancy information may be calculated from data 206. If the user chose to implement the more robust CRC-32 (32-bit) scheme, 32 bits of redundancy information may be created. No redundancy information is generated if the user chose not to implement data integrity protection. The redundancy information may be added to the data 206 following the optional pad byte.

At step 232, the data 206 may be encapsulated as a packet using SOP and EOP markers. Data being transmitted using the data port is provided with the SOP marker characters SDP1 and SDP2 and the EOP marker characters EGP1 and EGP2, as shown in FIG. 8. Data being transmitted using the priority port is provided with the SOP marker characters SPP1 and SPP2 and the EOP marker characters EGP1 and EGP2.

Following data encapsulation, the encapsulated data packet may be transmitted from the local integrated circuit to the remote integrated circuit (step 234). Idle characters and clock compensation codes may be inserted as needed.

Data packets sent using the data port are sent using a "cut-through" data flow method. With this approach, packet data is transmitted as soon as sufficient data is available, without waiting for an entire packet to be available to transmitter circuitry 114. The cut-through approach provides low latency for the data path and can be used where latency delays are undesirable. Priority packets may be delivered using a "store-and-forward" data flow method. With the store-and-forward approach, no packet data is transmitted until the entire packet has been provided to the transmitter circuitry 114. Because priority packet data must be received into data buffer 144 before it can be transmitted, the size of data buffer 144 determines the upper limit on the allowable size of a priority packet. There is no limit to the allowed length of regular data packets, which can be particularly beneficial in applications such as medical image processing in which it is often necessary to transport large packets in a burst.

Figure 11:
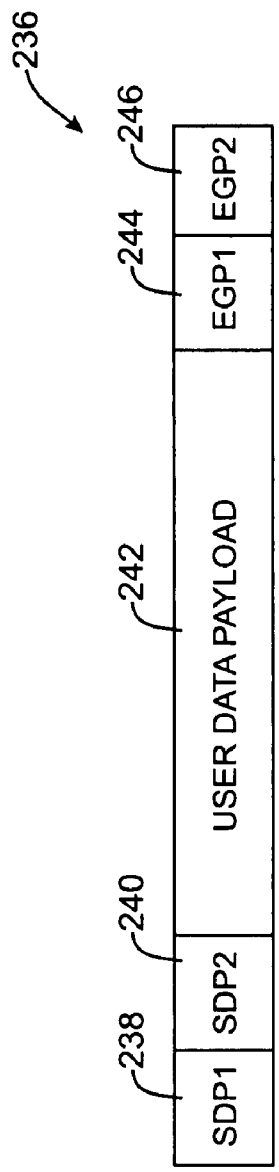
FIG. 11 is a data diagram showing a typical user data packet constructed in accordance with the present invention.

Data transmitted using the priority port will take precedence over data being transmitted using the data port. As a result, priority data packets will be nested within regular data packets when regular and priority data is available for transmission at the same time. A regular data packet 236 is shown in FIG. 11. Packet 236 has a data payload 242 encapsulated between SOP markers 238 and 240 and EOP markers 244 and 246. When it is desired to transmit priority data over link 14 (e.g., data that is needed to control an important system function), the user can send that data to the priority port.

Figure 12:
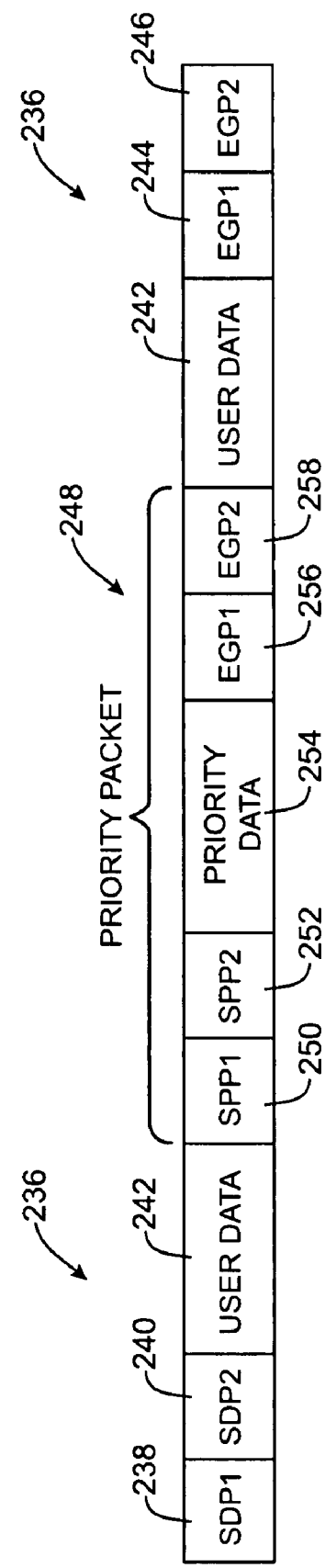
FIG. 12 is a data diagram showing how a priority packet may be nested within a regular data packet in accordance with the present invention.

Priority data is encapsulated in a packet and is transmitted over the link 14. Because priority data takes precedence over regular data, the normal transmission of the regular data packet is temporarily interrupted by the transmission of the priority data packet. This results in the priority data packet 248 becoming nested within the regular data packet 236, as shown in FIG. 12. As shown in FIG. 12, the priority data packet includes a priority data payload 254 (the length of which the protocol may restrict to limit the required size for the user packet buffer 144) that has been encapsulated between priority data packet SOP characters 250 and 252 and priority data packet EOP marker characters 256 and 258. The packet 248 breaks the regular data packet data payload 242 into two portions. (Idle characters and clock tolerance compensation characters may also be inserted in the packets of FIGS. 11 and 12 as needed, but these characters are not shown in FIGS. 11 and 12 for clarity.)

Figure 13:
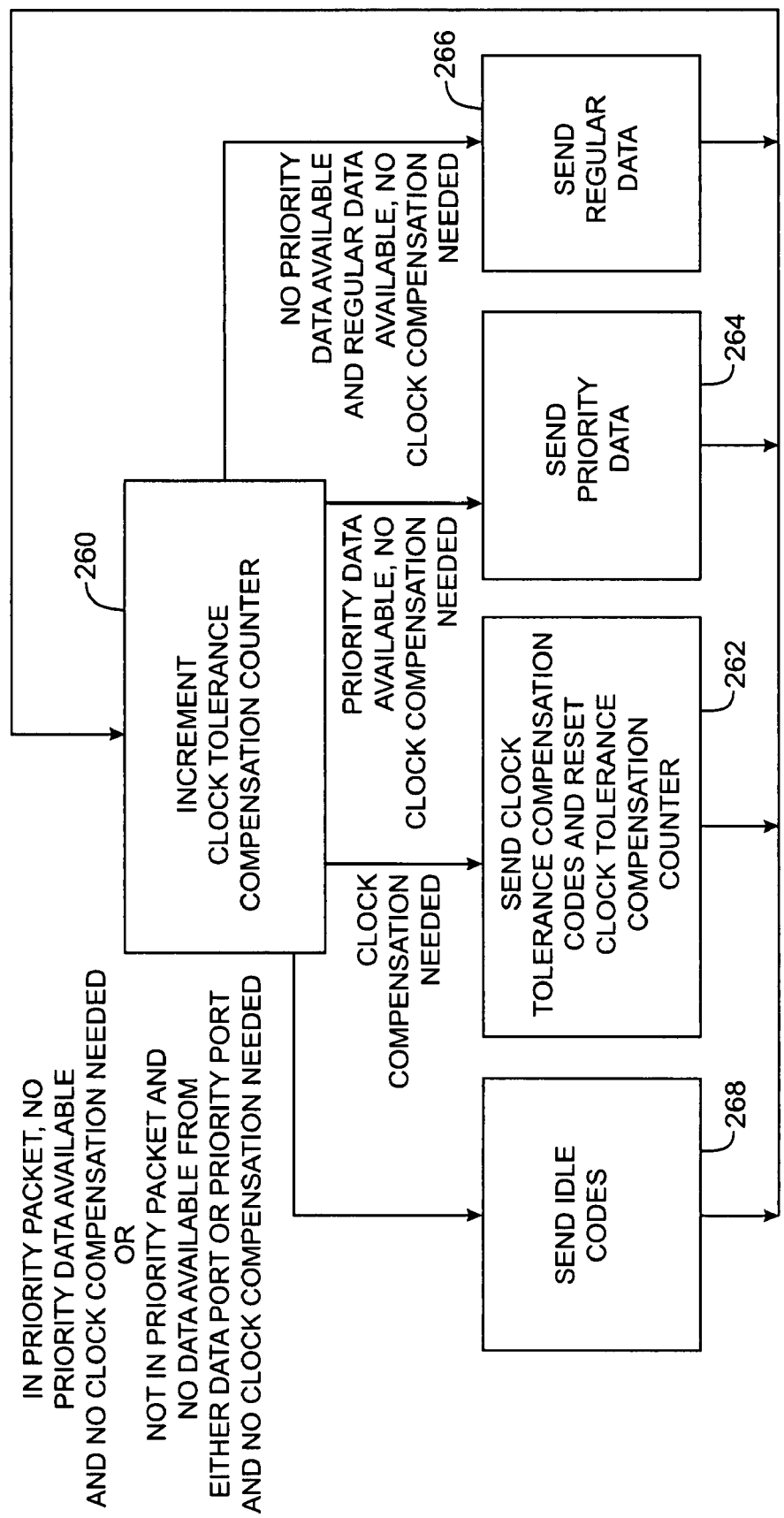
FIG. 13 is a flow chart of illustrative steps involved in transmitting regular and priority data in an integrated circuit in which both a regular data and a priority data port have been implemented in accordance with the present invention.

A flow chart of illustrative steps involved in transmitting data over link 14 when both a data port and priority port have been implemented in circuit 110 is shown in FIG. 13. At step 260 a clock tolerance compensation counter may be incremented (if clock tolerance compensation circuitry has been implemented on circuit 110).

If the counter reaches a limit value that indicates that a clock tolerance compensation character is needed, clock tolerance compensation codes from clock compensation code generator 164 are inserted into the data using data path multiplexer 154 (step 262). The clock tolerance compensation counter is then reset and control loops back to step 260.

If priority data is available and no clock compensation codes are currently required, the priority data is sent over link 14 from the priority data buffer circuitry in data buffer 144 (step 264). Data encapsulation circuit 152 encapsulates the priority data by adding the priority data packet SOP and EOP markers. Data path multiplexer 154 directs the priority data path data into the data path. After the priority data has been sent, the circuit returns to step 260.

If regular data is available for transmission and if no priority data is available and no clock compensation codes are needed, the regular data may be sent at step 266. The regular data is encapsulated using data encapsulation circuit 152. The control circuitry 160 directs data path multiplexer 154 to merge the regular data from data encapsulation circuit 152 into the data path so that the regular data is transmitted over link 14.

If there is a gap in the data to be transmitted, idle codes may be inserted into the data path. In particular, idle codes may be inserted into the data path at step 268, provided that the circuit (1) is in a priority packet with no currently available priority data to send and no clock tolerance compensation codes being currently required, or (2) is not in a priority packet and no data is available for transmission from either the data port or the priority port and no clock tolerance compensation codes are currently required. (If desired other functions may be used to control the insertion of idle characters—e.g., a flow control function that is in a pause state, etc.)

When both the regular data port and priority data port are used, as in the process of FIG. 13, regular data transmission may be made using the data port. System messages or any other priority information may be sent through the priority port, which interrupts the regular data.

Figure 14A:
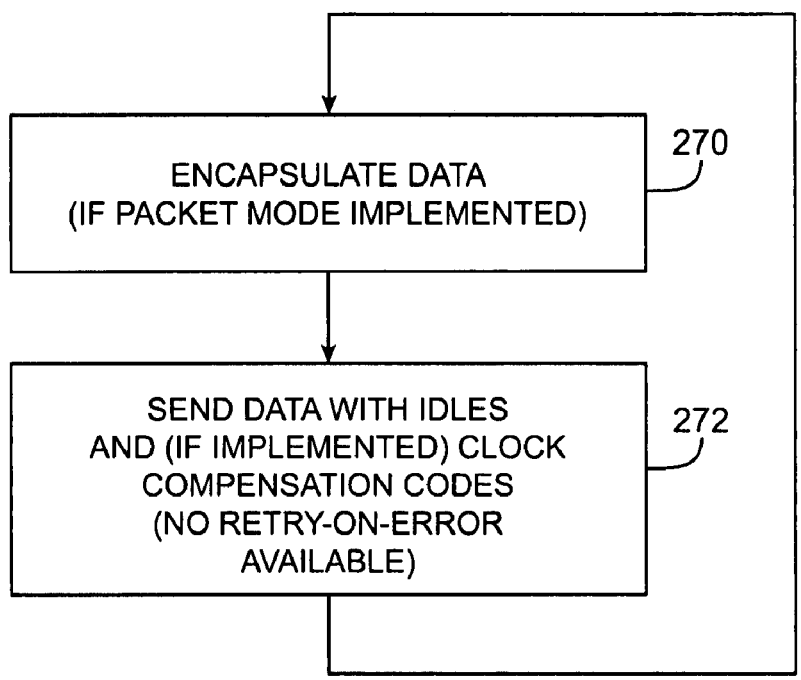
FIG. 14a is a flow chart of illustrative steps involved in transmitting packetized data in an integrated circuit in which a regular data port has been implemented, but no priority port has been implemented in accordance with the present invention.

The user may chose to only implement a data port in circuit 110. In this situation, the circuit transmits regular data using the process of FIG. 14*a*. If the "packetized" data mode has been selected, the regular data to be transmitted is first encapsulated at step 270. If the "streaming" data mode has been selected, encapsulation is not performed. At step 272, the regular data is transmitted over link 14. In particular, control circuitry 160 controls multiplexer 154 to ensure that clock tolerance compensation codes (if clock tolerance compensation has been implemented) and idle codes are inserted at appropriate times.

Retry-on-error functionality requires a store-and-forward arrangement using a circular buffer. This circular buffer is not implemented in circuit 110 when only a regular data port is implemented. Accordingly, retry-on-error functionality cannot be provided using the arrangement of FIG. 14*a*. Because data is transmitted using a cut-through approach rather than a store-and-forward approach, latency is reduced. The approach of FIG. 14*a* may therefore be desired when low latency is an important design consideration. Moreover, because no circular buffer is used, data packets may be extremely large (essentially unlimited size) and are not limited by the size of the circular buffer. Without the need to support retry-on-error operations, the bits in the SOP markers that would otherwise be used for packet numbering may be put to other uses (e.g., to expand the number of user-labeled data channels a user may implement).

Figure 14B:
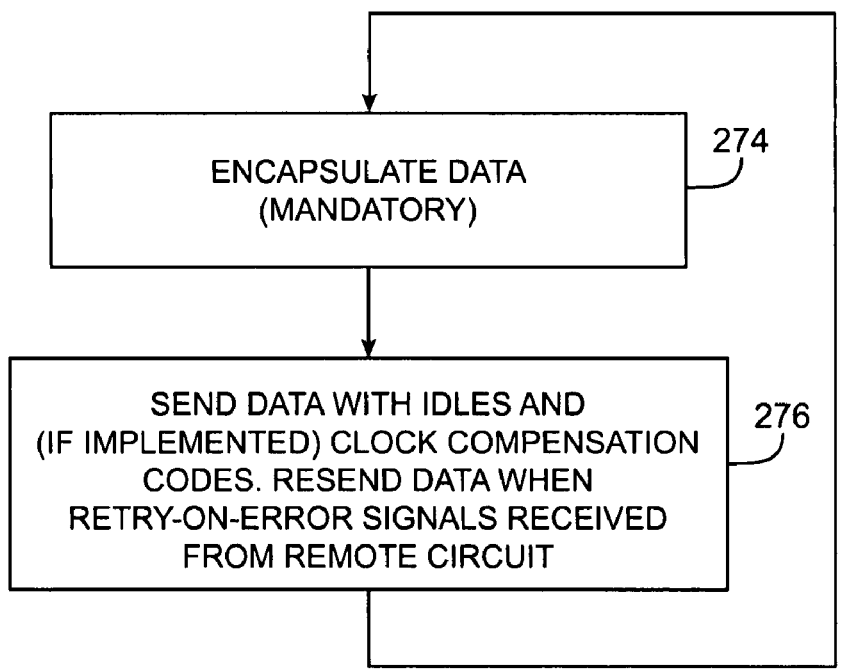
FIG. 14b is a flow chart of illustrative steps involved in transmitting packetized data in an integrated circuit in which a priority data port has been implemented, but no regular data port has been implemented in accordance with the present invention.

If the user opts to implement only a priority port in circuit 110, data may be transmitted over link 14 using the process of FIG. 14*b*. All priority port data is packetized, so at step 274 a mandatory data encapsulation step is performed to encapsulate the priority data in a packet. At step 276, the priority packet is transmitted over link 14. During step 276, the circuit inserts idle characters and (if implemented) clock tolerance compensation codes.

If selected by the user, retry-on-error functions can be used at step 276 to help ensure successful transmission of data over the link. When retry-on-error capabilities are provided, packets are labeled with packet numbers by circuit 110. The packet number information is provided within the priority packet SOP markers, so less of the marker capacity is available for implementing additional features (such as for implementing user-defined channel multiplexing schemes) than would be available if the retry-on-error capabilities were not used. However, the retry-on-error scheme provides a more robust link that is less prone to disruption by errors than schemes without retry-on-error.

Priority data is transmitted through a circular buffer in data buffer 144 using a store-and-forward arrangement. The use of the store-and-forward arrangement allows retry-on-error functions to be implemented, but adds a degree of latency to the transmission process. The circular buffer also imposes a maximum packet size limitation on priority data, because data must be stored in the circular buffer before it is sent. The use of the circular buffer and the store-and-forward data transmission arrangement prevents the priority data port from being used to handle streaming data. If a user desires to stream data over link 14, the regular data port may be used.

Three different levels of data integrity protection are available: (1) no protection, (2) CRC-16, and (3) CRC-32. These are illustrative levels of data integrity protection that may be implemented using the serial communications protocol of the invention. Other suitable arrangements may use fewer levels of protection, may use more levels of protection, or may be implemented using a different type of redundancy algorithm.

Figure 15:
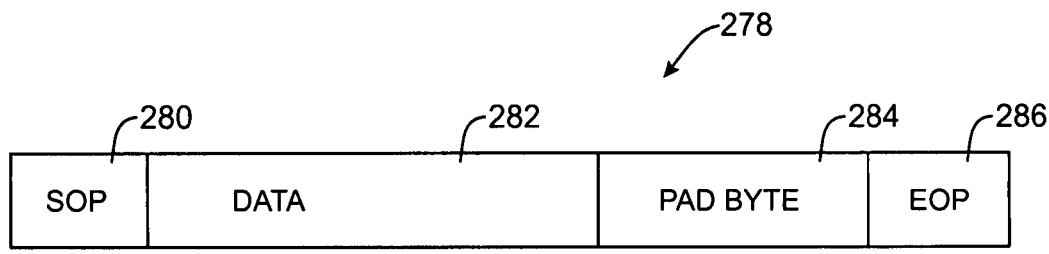
FIG. 15 is a data diagram showing the appearance of a data packet when data integrity protection has not been implemented on an integrated circuit in accordance with the present invention.

An illustrative data packet 278 that may be transmitted by circuit 110 when no data integrity protection has been implemented is shown in FIG. 15. The data payload 282 and optional pad byte 284 are encapsulated between SOP markers 280 and EOP markers 286. There is no redundancy information for performing error checking associated with packet 278. Because no data integrity protection capabilities are required, the circuitry for performing cyclic redundancy checking operations or other suitable data error checking functions may be omitted from the receiver circuitry 116, thereby reducing the amount of resources consumed by integrated circuit 110.

Figure 16:
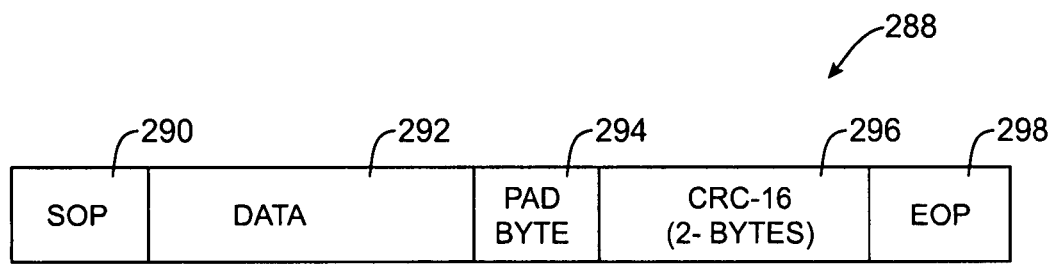
FIG. 16 is a data diagram showing the appearance of a data packet when a 16-bit cyclic redundancy check (CRC-16) data integrity protection scheme has been implemented on an integrated circuit in accordance with the present invention.

An illustrative data packet 288 when a first level of data integrity protection has been implemented is shown in FIG. 16. In the example of FIG. 16, data integrity protection is provided using a 16-bit cyclic redundancy check (CRC-16) arrangement. CRC operations are performed on the data before it is transmitted to produce CRC-16 data 296, which contains compressed information on the data 292. The redundancy data 296 may be encapsulated between the SOP and EOP markers 290 and 298 before encapsulation with the data payload 292 and optional pad byte 294. After the data packet 288 has been transmitted over link 14, the redundancy information 296 and contents of data payload 292 can be compared using data error checking circuitry 190 (FIG. 6) to determine whether the transmission of the data packet 288 over link 14 has introduced any errors.

Figure 17:
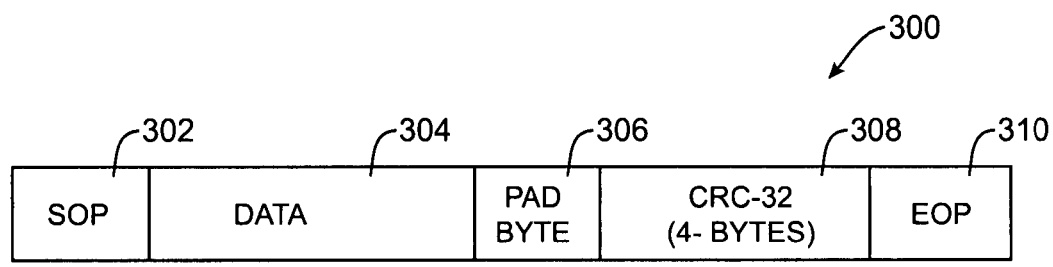
FIG. 17 is a data diagram showing the appearance of a data packet when a 32-bit cyclic redundancy check (CRC-32) data integrity protection scheme has been implemented on an integrated circuit in accordance with the present invention.

A stronger form of CRC redundancy may be provided using a 32-bit CRC arrangement. With this type of arrangement, 32-bits of CRC redundancy information 308 are provided in packet 300, as shown in FIG. 17. The CRC redundancy information 308, data payload 304, and optional pad byte 306 are encapsulated between SOP and EOP markers 302 and 310 before transmission of the packet 300 over link 14.

Figure 18:
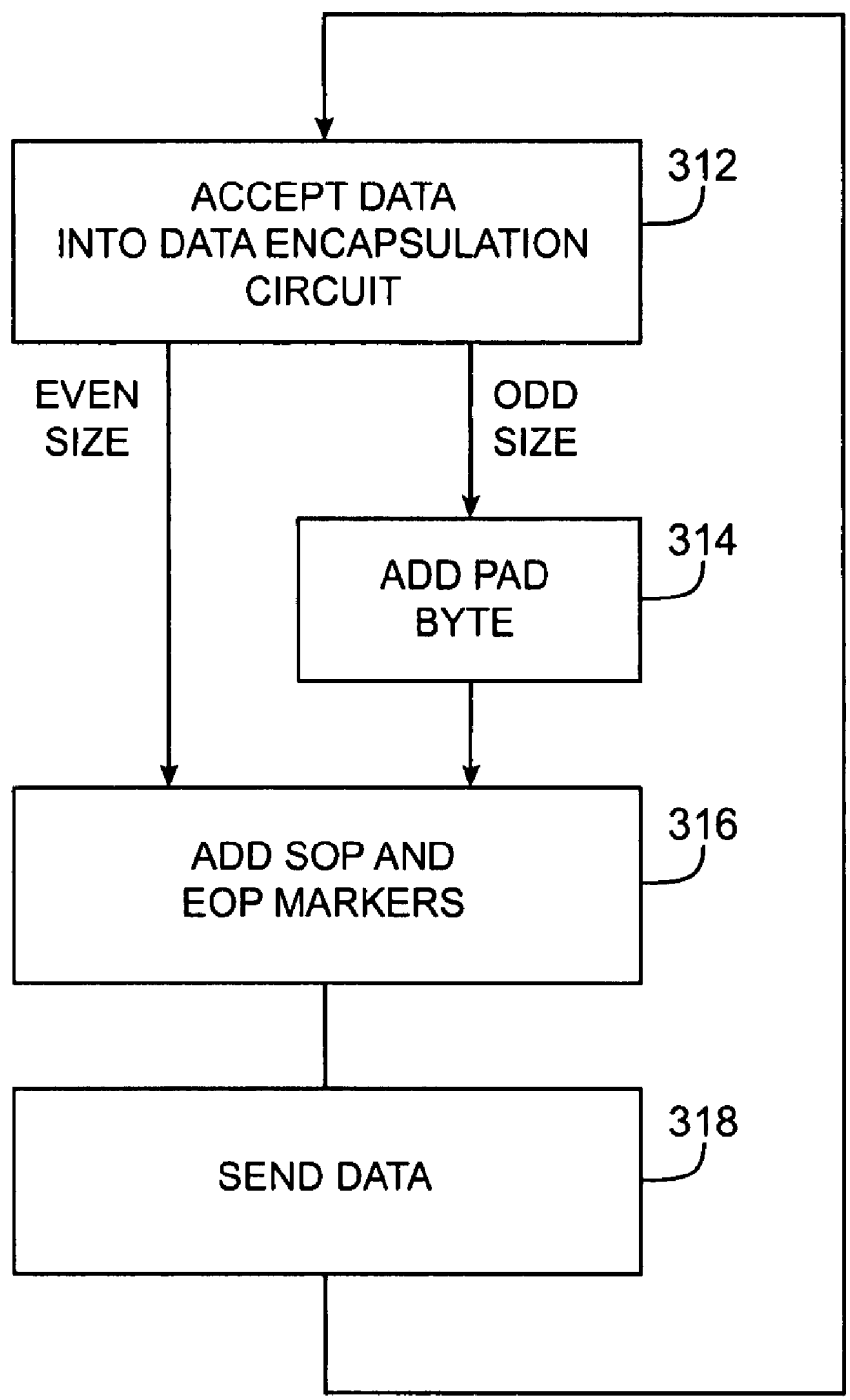
FIG. 18 is a flow chart of illustrative steps involved in transmitting data from an integrated circuit in which data integrity protection has not been implemented in accordance with the present invention.

The flow chart of FIG. 18 shows illustrative steps involved in transmitting data packets when no data integrity protection has been implemented. At step 312, the data to be transmitted that has been accepted into data buffer 144 from logic 112 is passed from data buffer 144 to data encapsulation circuit 152. If the length of the data has an odd number of bytes, a pad byte may be added at step 314. At step 316, the SOP and EOP markers are added to the beginning and end of the data payload by encapsulation circuit 152 to form a packet. The packet is transmitted to the remote integrated circuit at step 318. Idle codes and clock compensation codes can be inserted if needed.

Figure 19:
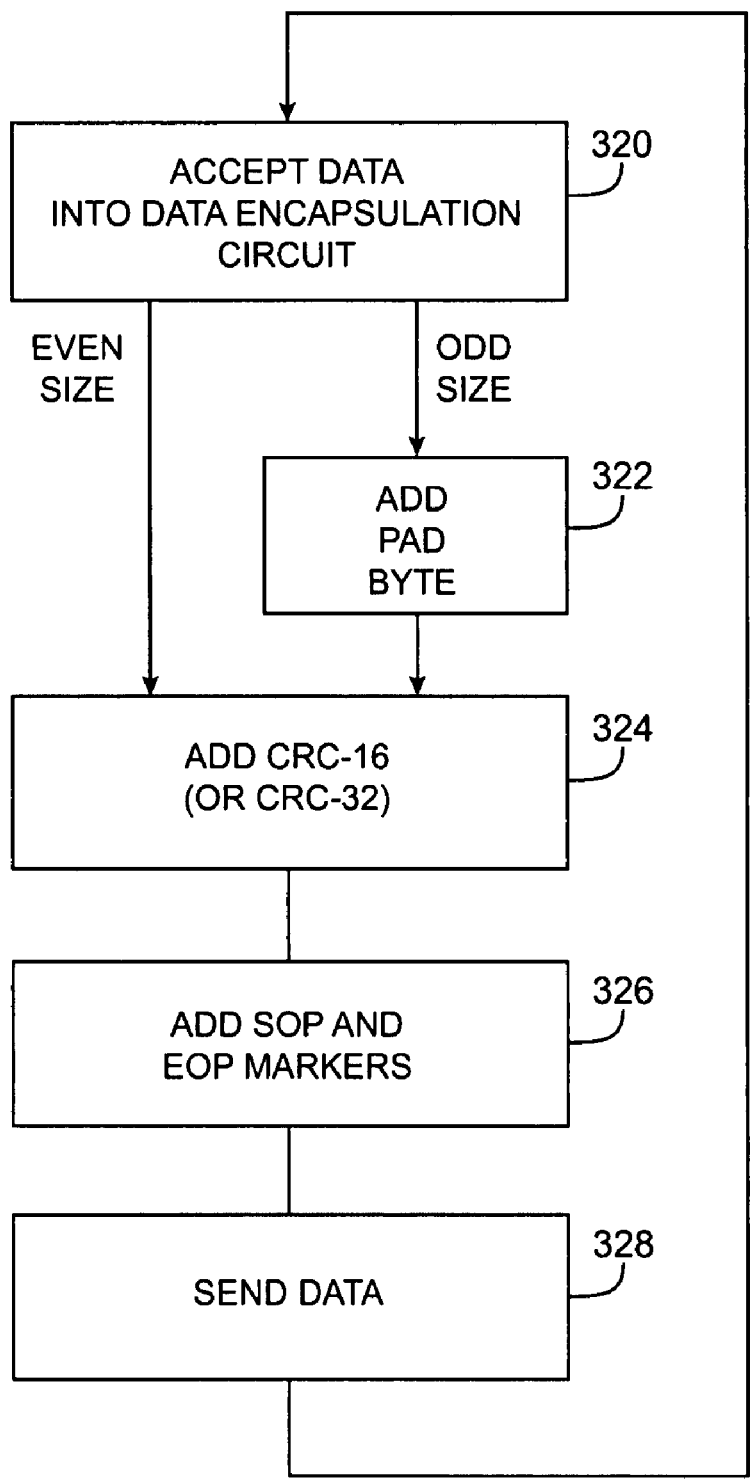
FIG. 19 is a flow chart of illustrative steps involved in transmitting data from an integrated circuit in which data integrity protection based on a CRC-16 or CRC-32 redundancy scheme has been implemented in accordance with the present invention.

If the user chose to implement either the CRC-16 or CRC-32 scheme, the data transmission process is different, as shown in FIG. 19. At step 320, data is accepted into data encapsulation circuit 152 (FIG. 6). If the data has an odd number of bytes, a pad byte may be added to the payload at step 322. At step 324, the CRC information is calculated and added to the payload and optional pad byte. If a CRC-16 scheme is being used, 16 bits of CRC information are added, as shown in FIG. 16. If a CRC-32 scheme is being used, 32 bits of CRC redundancy information are added, as shown in FIG. 17. The CRC covers all characters in the data from the second field in the SOP sequence through the pad character (if used). At step 326 of FIG. 19, The data encapsulation circuit 152 adds SOP and EOP markers to the data packet. The data packet may then be transmitted over link 14 (step 328), with idle codes and clock compensation codes added if needed. Because the user can select between different levels of data integrity protection, the data integrity protection capabilities of the circuit can be optimized based on considerations such as packet size and desired application.

At the remote integrated circuit, receiver circuitry 116 is used to receive the transmitted data packets. If error correction has been implemented, the CRC-16 or CRC-32 information may be used to help determine whether there has been an error in the transmission of the data over link 14.

Figure 20:
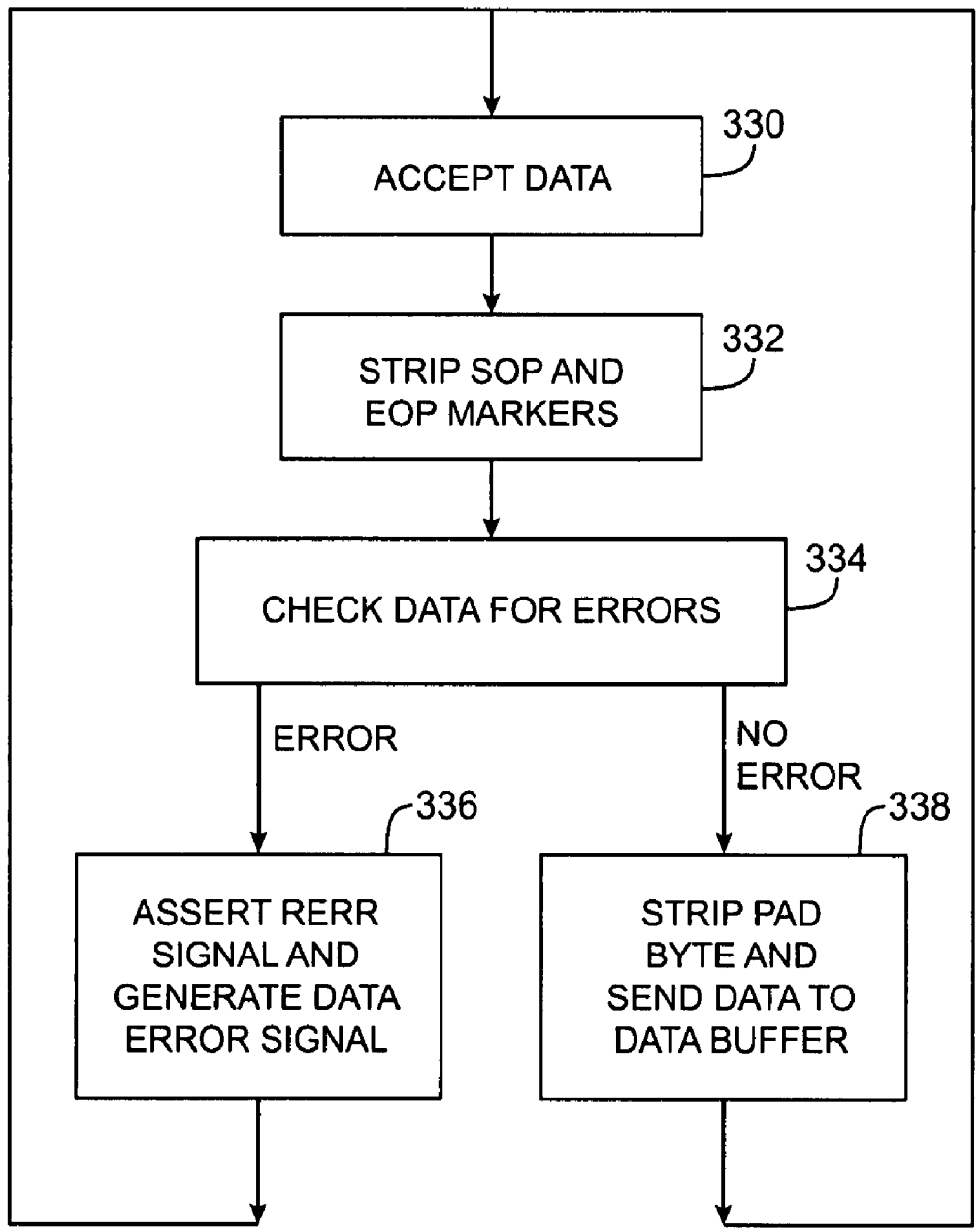
FIG. 20 is a flow chart of illustrative steps involved in receiving data into an integrated circuit in which a regular data port has been implemented in accordance with the present invention.

Illustrative steps involved in receiving regular (non-priority) data transmitted from a regular data port on a local circuit to a regular data port on a remote circuit are shown in FIG. 20. At step 330, data is accepted into the receiver 116. At step 332, the SOP and EOP markers are stripped from the incoming packet using lane stripping and packet processing circuitry 186. If the CRC-16 or CRC-32 redundancy information is present, that information can be used by data error checking circuitry 190 to determine whether the transmitted data payload has an error (step 334). If the received regular data payload is determined to have an error at step 336, an RERR signal is asserted on ERR port 192 and a data error signal is generated on error status port 194. This alerts logic 112 that a data error on the regular data port error has been detected. If the received regular data payload is determined not to contain any errors, the pad byte may be stripped (if it was present) and the received data may be passed to the regular data port buffer circuitry in data buffer 176 (step 338).

Figure 21:
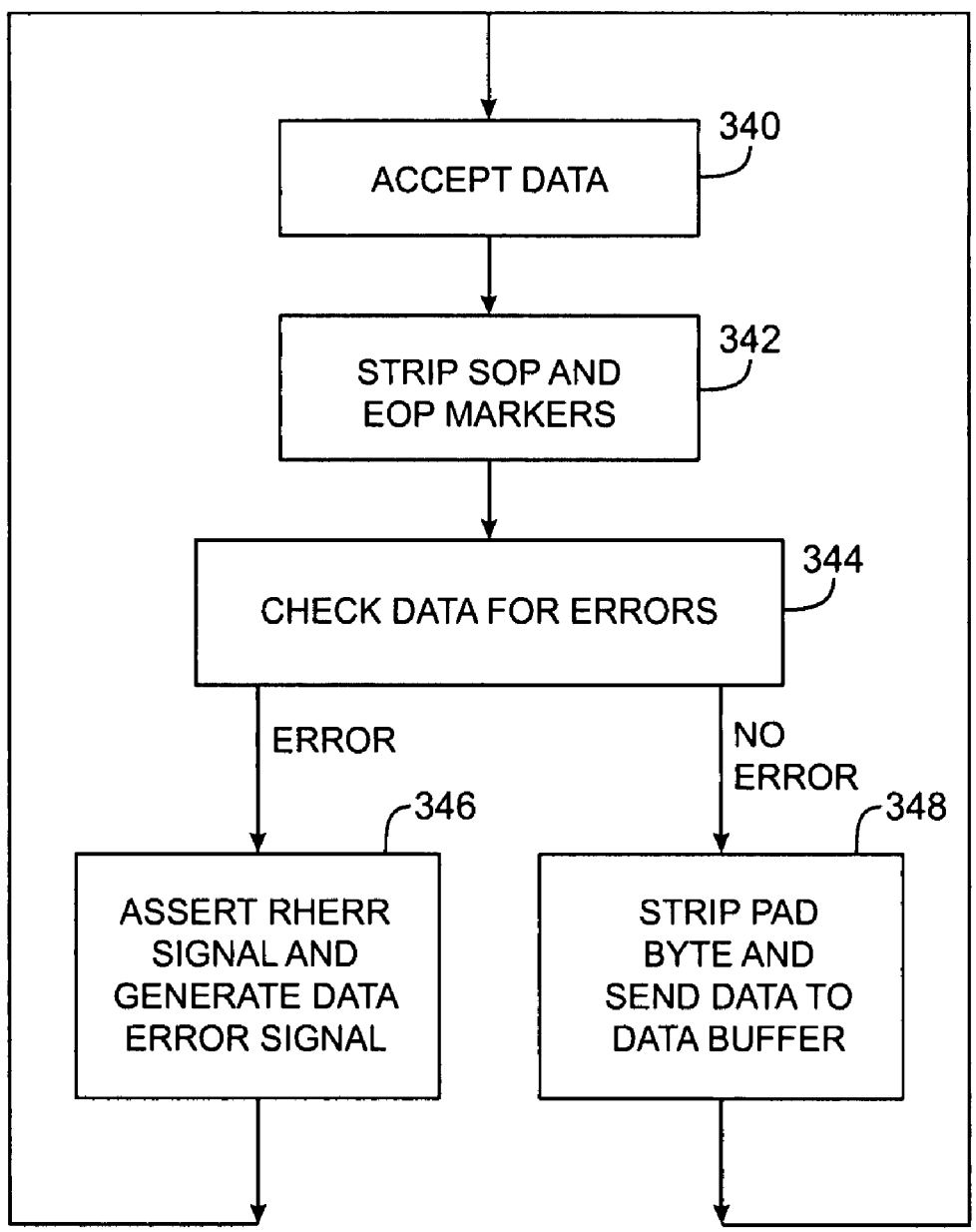
FIG. 21 is a flow chart of illustrative steps involved in receiving data into an integrated circuit in which a priority data port without retry-on-error capabilities has been implemented in accordance with the present invention.

Illustrative steps involved in receiving priority data packets transmitted from a priority data port on a local circuit to a priority data port on a remote circuit when the retry-on-error function has not been implemented are shown in FIG. 21. At step 340, data is accepted into the receiver 116. The SOP and EOP markers are stripped from the incoming packet using lane stripping and packet processing circuitry 186 (step 342). If CRC-16 or CRC-32 redundancy information is present, it can be used by data error checking circuitry 190 to check whether the transmitted data payload has an error (step 344). If the received priority data payload is determined to have an error at step 346, an RHERR signal is asserted on ERR port 192 and a data error signal is generated on error status port 194. This alerts logic 112 that a data error on the priority data port has been detected. If the received priority data payload is determined not to contain any errors, the pad byte may be stripped (if it was present) and the received data may be passed to the priority data port buffer circuitry in data buffer 176 (step 348).

Figure 22:
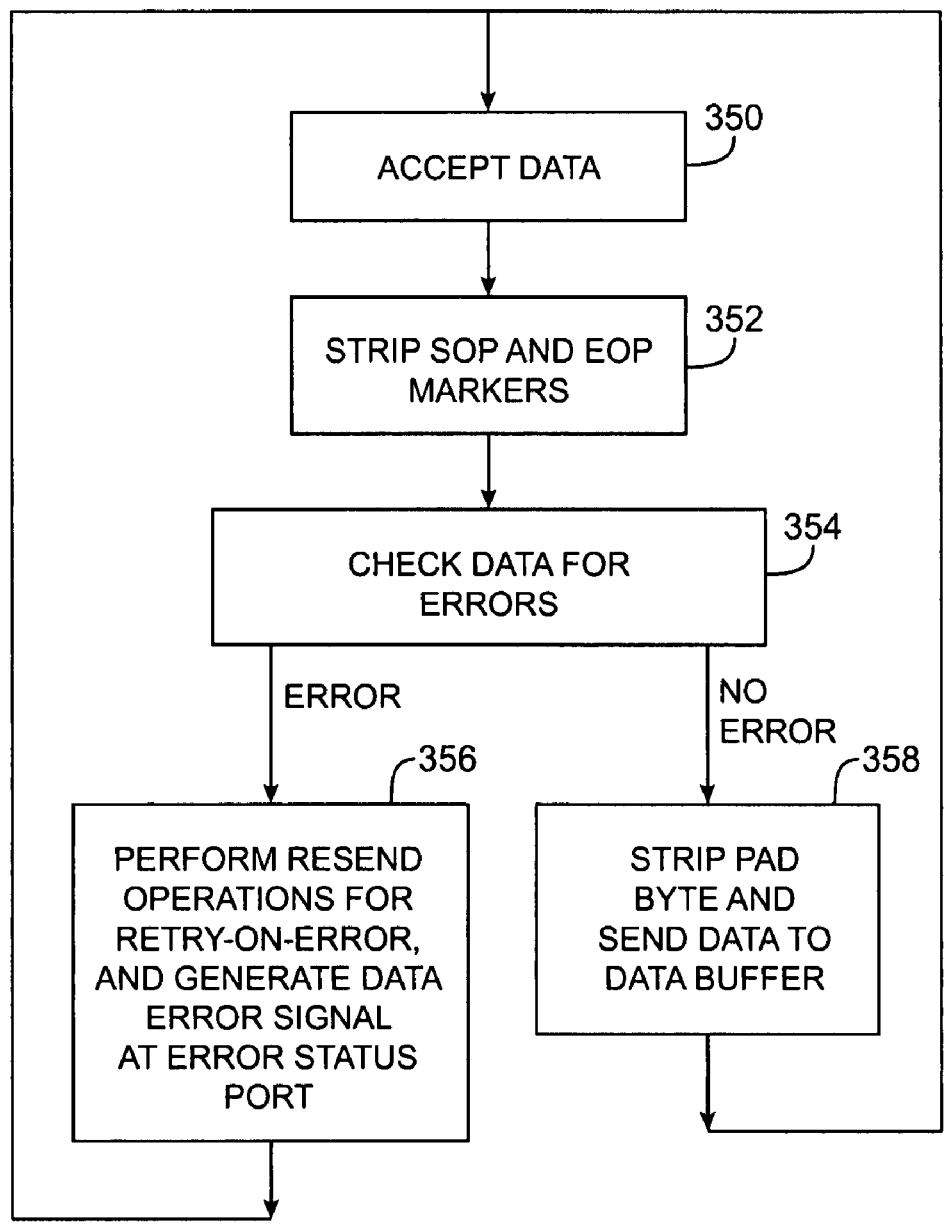
FIG. 22 is a flow chart of illustrative steps involved in receiving data into an integrated circuit in which a priority data port with retry-on-error capabilities has been implemented in accordance with the present invention.

Illustrative steps involved in receiving priority data packets transmitted from a priority data port on a local circuit to a priority data port on a remote circuit when the retry-on-error function has been implemented are shown in FIG. 22. At step 350, data is accepted into the receiver circuitry 116 of the remote circuit. The SOP and EOP markers are stripped from the incoming packet using lane stripping and packet processing circuitry 186 (step 352). If CRC-16 or CRC-32 redundancy information is present, it can be used by data error checking circuitry 190 to check whether the transmitted data payload has an error (step 354). If the received priority data payload is determined to have an error, retry-on-error resend operations may be performed and data error signals may be generated at step 356. Performing the retry-on-error operations provides the transmitting circuit with another opportunity to transmit the data without errors. If the received priority data payload is determined not to contain any errors, the pad byte may be stripped (if it was present) and the received data may be passed to the priority data port buffer circuitry in data buffer 176 (step 358).

The serial communications protocol of the invention allows users to selectively implement an optional data channel multiplexing feature. With this feature, the user may define multiple "channels" in link 14. Each channel serves as an independent bus and may be used to transmit a different type of data across link 14 (for example). A given data packet must belong exclusively to a single channel, but other packets can belong to different channels. The number of channels used bears no relation to the number of lanes 16 in link 14. For example, multiple user-defined data channels may be used in links 14 that contain only a single lane.

A channel number is associated with each user-defined channel. At the local integrated circuit, the channel number may be embedded into the SOP marker information associated with each packet. Up to 256 independent data channels may be defined by the user when the regular data port is used. When the priority port is used, some of the SOP marker information is used for labeling packet numbers for retry-on-error operations. Less room is therefore available in the SOP fields of priority packets for use in channel numbering. As a result, when the priority port is used, up to 16 independent data channels may be defined.

Figure 23:
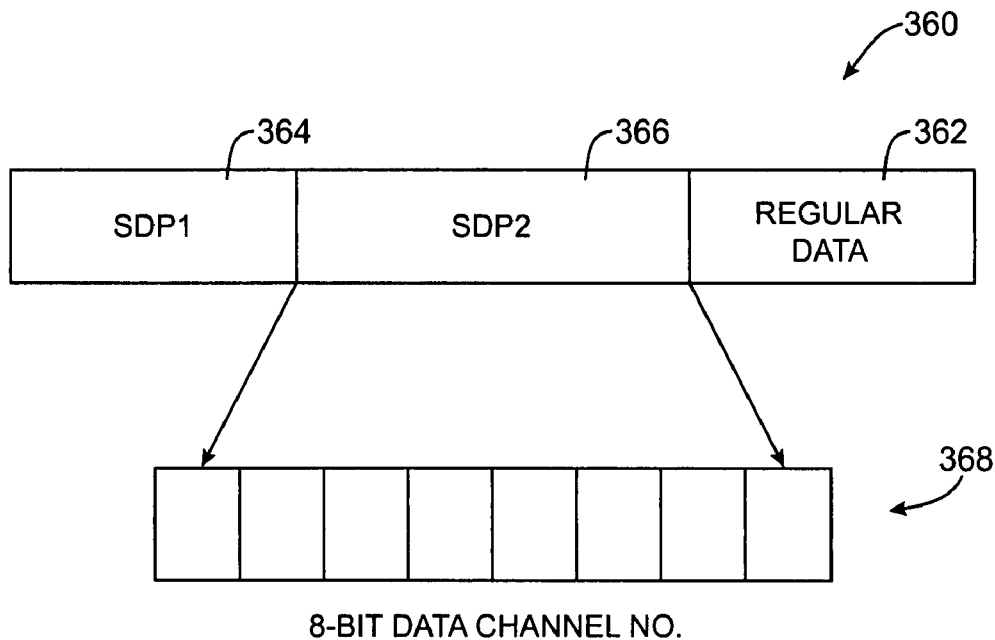
FIG. 23 is a diagram showing how the SDP2 field in a start-of-packet (SOP) marker in a regular data packet can contain a user-defined 8-bit data channel number for use in data channel multiplexing arrangements in accordance with the present invention.

The SOP marker information that accompanies regular data packets when user-defined data channel multiplexing is used is shown in FIG. 23. The portion of the packet 360 shown in FIG. 23 has a regular data payload 362 to which SOP information has been added by data encapsulation circuit 152. The SOP information includes two characters—an SDP1 character 364 and an SDP2 character 366. Each character contains 8 bits. As shown in the detail at 368, the 8-bits of the SDP2 field may be used as an 8-bit channel number when a user desires to implement data channel multiplexing in circuit 110. The 8 bits of field 366 allow up to 256 channels to be defined for the regular data port.

Figure 24:
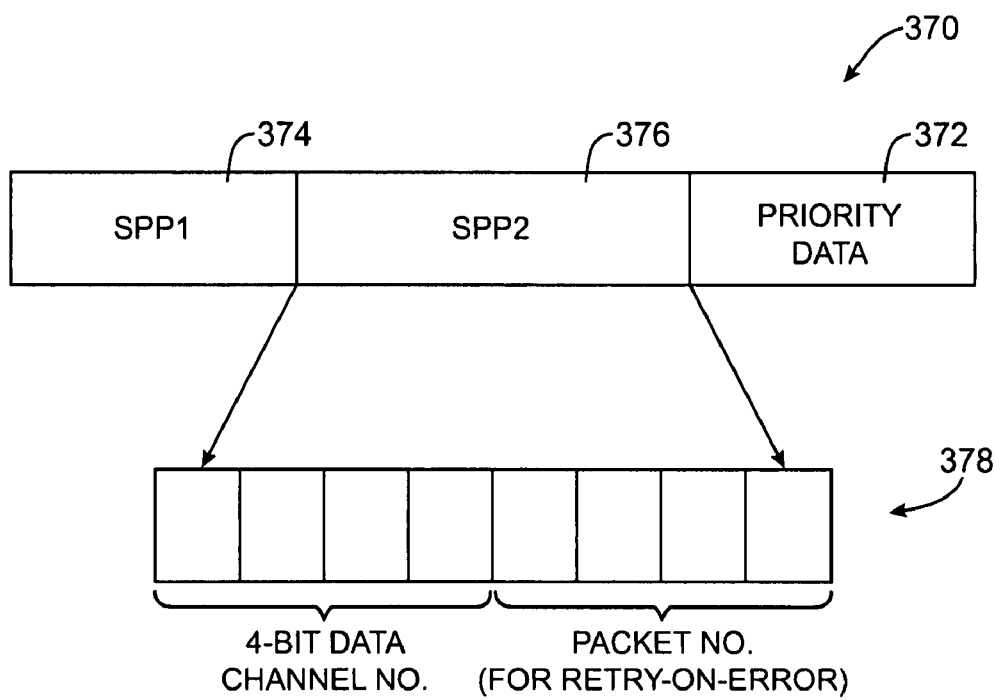
FIG. 24 is a diagram showing how the first portion of a SPP2 field in a start-of-packet (SOP) marker in a priority data packet can contain a user-defined 4-bit data channel number for use in data channel multiplexing arrangements in accordance with the present invention.

The SOP marker information that accompanies priority data packets when user-defined data channel multiplexing is used is shown in FIG. 24. The portion of the packet 370 shown in FIG. 24 has a priority data payload 372 to which SOP information has been added by data encapsulation circuit 152. The SOP information includes two characters—an SPP1 character 374 and an SPP2 character 376. Each character contains eight bits. As shown in the detail at 378, four of the eight bits of the SPP2 character are used to label the packet with a packet number. The packet number is used to label each packet for retry-on-error operations. The remaining four of the eight bits are used for the user-defined channel number for data channel multiplexing. The four channel number bits in the SPP2 field allow up to 16 user-defined data channels to be defined for the priority data port.

Figure 25:
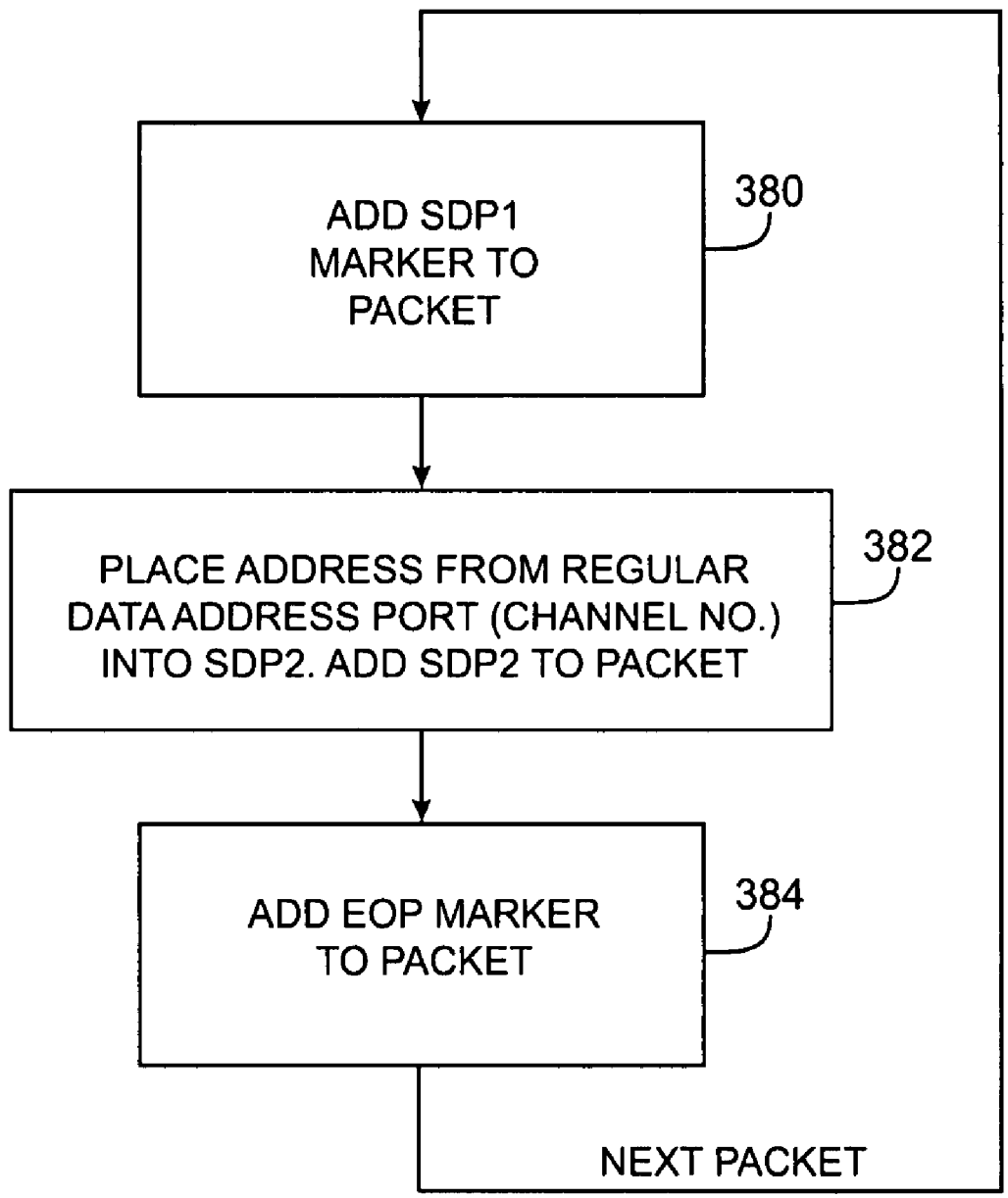
FIG. 25 is a flow chart of illustrative steps involved in embedding data channel information in a packet for a data channel multiplexing arrangement in an integrated circuit in which a regular data port has been implemented in accordance with the present invention.

Illustrative steps involved in using data channel numbers when encapsulating regular data in data encapsulation circuit 152 are shown in FIG. 25. At step 380, the SDP1 marker is added to the regular data payload. At step 382, the address from the regular data address port is placed into the SDP2 character and the SDP2 character is added to the packet, thereby completing the SOP information. The logic 112 generates signals on this address port that define the desired data channel number for the packet. If, for example, it is desired to send data on user-defined data channel No. 2, the address port signal 00000010 can be placed on the regular data address port. The data encapsulation circuit takes the data channel number information from the regular data address port and incorporates this information in the SDP2 information being used to encapsulate the regular data packet payload. At step 384, the EOP marker is added to the packet. The process then loops back to step 380, so that additional regular data packets can be processed.

Figure 26:
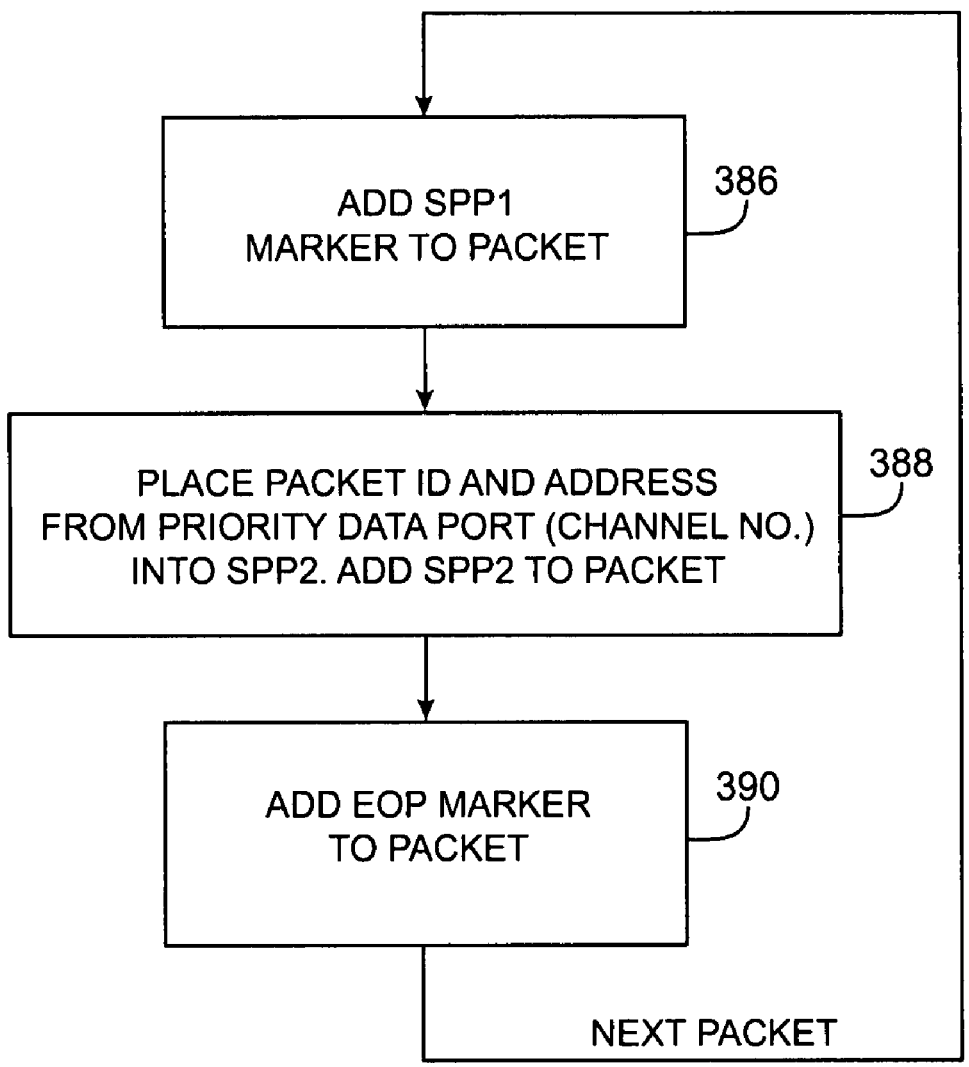
FIG. 26 is a flow chart of illustrative steps involved in embedding data channel information in a packet for a data channel multiplexing arrangement in an integrated circuit in which a priority data port has been implemented in accordance with the present invention.

Illustrative steps involved in using data channel numbers when encapsulating priority data in data encapsulation circuit 152 are shown in FIG. 26. At step 386, the SPP1 marker is added to the priority data payload. At step 388, SPP2 character is created and is added to the packet. When creating the SPP2 character, the packet identifier (i.e., the packet number) is used for the first four bits and the address from the priority data address port is placed into the second four bits. The logic 112 generates signals on this address port that define the desired data channel number for the packet. If, for example, it is desired to send data on user-defined data channel No. 3, the address port signal 0011 can be placed on the priority data address port. The data encapsulation circuit takes the data channel number information from the priority data address port and incorporates this information in the last four bits of the SPP2 information being used to encapsulate the priority data packet payload. At step 390, the EOP marker is added to the packet. The process then loops back to step 386, so that additional priority data packets can be processed.

Figure 27:
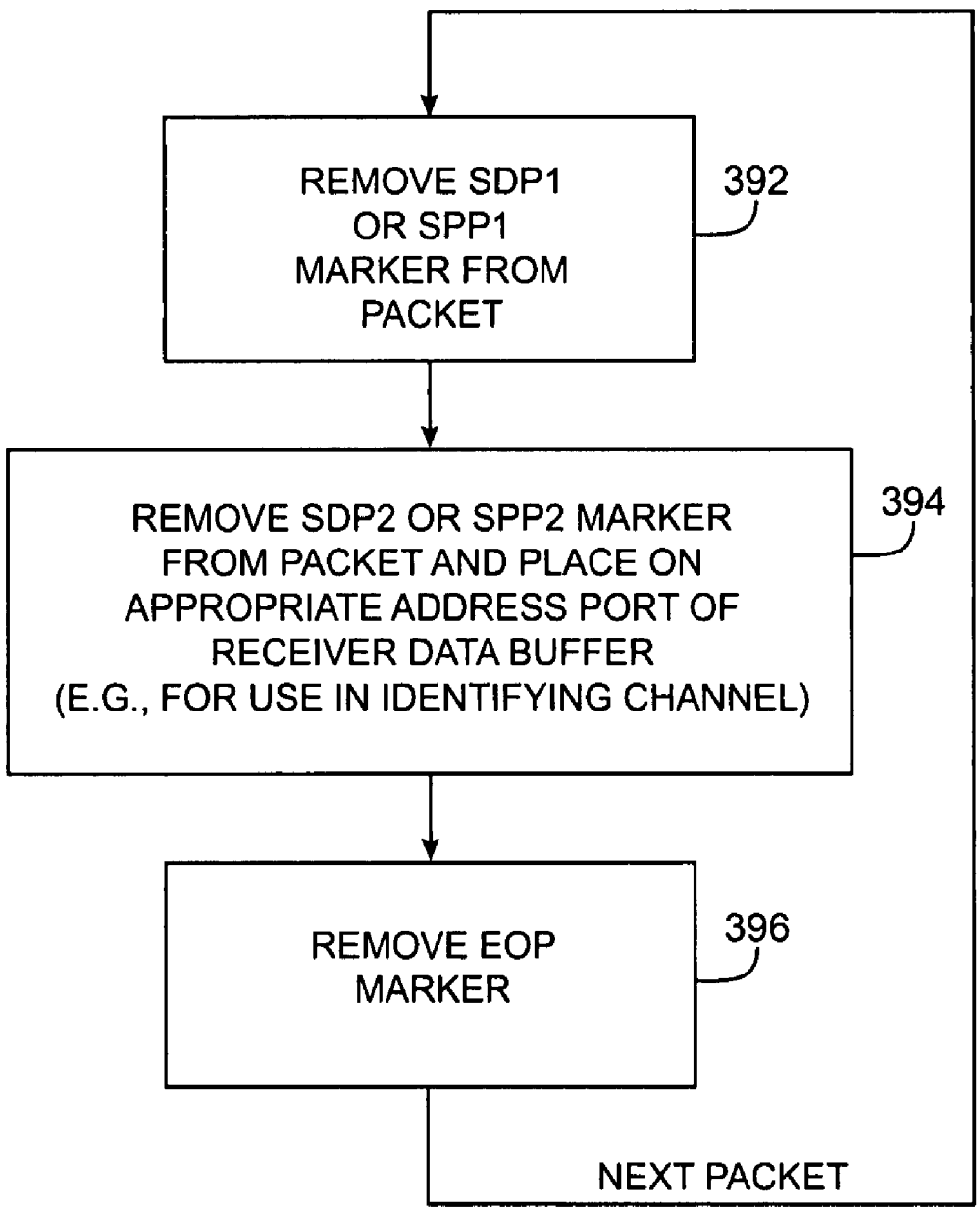
FIG. 27 is a flow chart of illustrative steps involved in extracting embedded data channel information from received packets in integrated circuits in which either a regular data port or a priority data port has been implemented in accordance with the present invention.

When the packets are received at the remote integrated circuit 110, the channel number information used for data channel multiplexing is extracted. Illustrative steps involved in this process are shown in FIG. 27. At step 392, the lane stripping and packet processing circuitry 186 removes the first marker character from the packet. If the packet is a regular data packet, the lane stripping and packet processing circuitry 186 removes the leading SDP1 character. If the packet is a priority data packet, the lane stripping and packet processing circuitry 186 removes the leading SPP1 byte.

At step 394, the second SOP character is extracted from the received packet. If the received packet is a regular data packet, the SDP2 character is extracted. If the received packet is a priority data packet, the SPP2 character is extracted. The data channel number can then be obtained from the 8 bits of SDP2 or (in the case of a priority packet) from the last 4 bits of SPP2. The data channel number may be placed on the appropriate address port 177 of the receiver data buffer 176. The data channel number may then be used by logic circuitry 112 to associate the received packet data with the appropriate user-defined channel number.

At step 396, the EOP information may be removed from the packet, before the process returns to step 392 for handling additional packets.

The user-defined data channel multiplexing feature allows the user to convey data on one or more separate channels on link 14 at the link layer. The data channel information embedded in the SOP markers is used to identify which packets are associated with which data channels. If desired (e.g., if the data channel multiplexing feature is not being used in this way), the data channel label bits may be used to convey other user data.

The data path of the serial communications protocol of the present invention has low overhead and is configurable. Compliant circuits can communicate over high bandwidth serial links using relatively few circuit resources. Optional features include data mode (streaming/packetized data), priority packet and link management packet nesting, and data integrity protection. During the design process, computer-aided design tools 62 may present the user with an option to select a desired signaling rate for the transmitter circuitry 114 and receiver circuitry 116. The signaling rate need not be fixed, but can be selected from an essentially continuous spectrum of rates from (for example) 100 Mbps to 10 Gbps in 1 Mbps increments (for example). Because the user is not forced to chose from one or a few fixed signaling rates, the user can select a signaling rate that is precisely tailored to the user's desired application.

The lane width (number of lanes 16) in link 14 may be varied from 1 to 256. Lane number information identifying the number of each lane 16 may be provided in an 8-bit training sequence character used during link initialization. Automatic lane polarity reversal and automatic lane order reversal are optional features that may be implemented in circuit 110. If automatic lane order reversal is implemented in the circuit 110, the order of the lanes 16 in link 14 can be detected and, if incorrect, can be automatically reversed. For example, if it is detected that the order of lanes in a four lane link is 4, 3, 2, 1, that lane order can be reversed to 1, 2, 3, 4, thereby ensuring proper communications over link 14 despite the incorrect initial ordering. The serial communications protocol of the present invention therefore provides an arrangement by which a large number of lanes can be incorporated into a link that supports lane order reversal.

When the regular data port is used, there is no limitation on the size of a data packet. Idles may be inserted into packets of any length to fill gaps in data.

Figure 28:
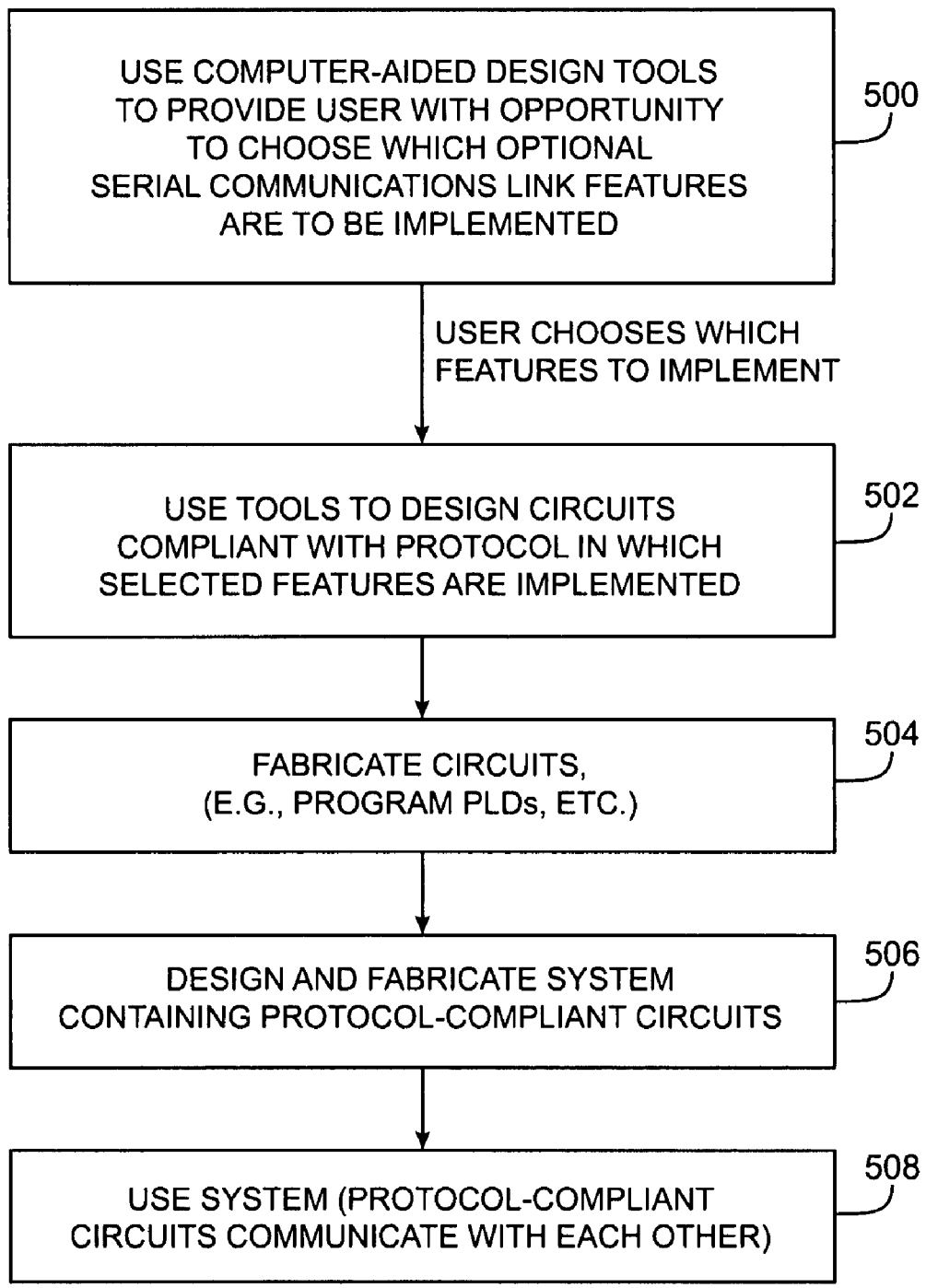
FIG. 28 is a flow chart of illustrative steps involved in designing and using integrated circuits that are compliant with a serial communications protocol in accordance with the present invention.

A flow chart of illustrative steps involved in designing and using integrated circuits that are compliant with a serial communications protocol in accordance with the present invention is shown in FIG. 28. At step 500, computer-aided design tools such as the tools 62 of FIG. 4 are used to provide the user (a single-person or multiperson logic design team) with an opportunity to choose which optional serial communications link features are to be implemented. The computer-aided design tools may, for example, display on-screen options with which the user may interact by clicking on items of interest. This is merely one illustrative arrangement by which the user can provide instructions to tools 62. Any suitable arrangement may be used if desired.

When designing a given integrated circuit, the user may direct the tools to implement some or all of the optional serial communications features of the serial communications protocol. At step 502, the tools are used to design one or more integrated circuits that are compliant with the serial communication protocol and in which circuitry is included for performing the functions of the selected optional features while omitting unnecessary circuitry (i.e., circuitry for performing the omitted optional features). If a programmable logic device is being designed, the output of the tools 62 may be provided as configuration data. The output of the tools may also be provided in the form of mask set data for producing integrated circuit lithographic masks for fabricating a circuit implementing the desired design.

After the tools 62 have been used to design the circuit(s) at step 502, the circuit(s) can be fabricated at step 504 (e.g., using semiconductor fabrication techniques, by programming a programmable logic device with configuration data, etc.).

At step 506, a system may be designed and fabricated that contains circuits that are compliant with the protocol. Typically, some of the optional features will have been implemented in the circuits and some of the optional features will have been omitted from the circuits. If desired, the system may contain some protocol-compliant circuits that contain all of the optional features. The system may also contain some protocol-compliant circuits in which all of the optional features that can be omitted have been omitted. During the design and fabrication process of step 506, care should be taken to ensure that the circuits that communicate with each other over links 14 in the system are compatible with each other. For example, if the user directs tools 62 to create a given integrated circuit with four lanes in its link 14, the user should design and fabricate the system to ensure that this circuit communicates only with a corresponding four-lane circuit.

At step 508, the system constructed at step 506 may be used. Because the circuits that are communicating over links 14 are all compliant with the serial communications protocol of the invention and because their transmitter, receiver, and control circuitry has been configured properly (by proper selection of options), the circuits communicate successfully.

The foregoing is merely illustrative of the principles of this invention and various modifications can be made by those skilled in the art without departing from the scope and spirit of the invention.

What is claimed is:

1. An integrated circuit comprising:
   transmitter circuitry for transmitting data over a serial communications link;
   receiver circuitry for receiving data over the serial communications link;
   control circuitry for controlling the transmitter circuitry and receiver circuitry, wherein the transmitter circuitry, receiver circuitry, are configured to transmit regular data through a regular data port and are configured to transmit priority data through a priority port, wherein when there is priority data to be sent through the priority port the transmission of regular data through the regular data port is interrupted and the priority data is nested within the regular data; and
   a data encapsulation circuit that encapsulates the regular data and priority data between two-byte start-of-packet codes and two-byte end-of-packet codes, wherein when the priority data is nested within the regular data, the start-of-packet and end-of-packet codes associated with the priority data are nested within the regular data.

2. The integrated circuit defined in claim 1, wherein the transmitter circuitry, receiver circuitry, and control circuitry are configured to implement a user-selected optional streaming data mode feature by transmitting and receiving streaming data over the serial communications link.

3. The integrated circuit defined in claim 2 further comprising an idle code generator that generates idle codes, wherein the transmitter circuitry and control circuitry are configured to insert the idle codes into the transmitted streaming data during gaps.

4. The integrated circuit defined in claim 2 further comprising a clock compensation code generator that generates clock tolerance compensation codes, wherein the transmitter circuitry and control circuitry are configured to insert the clock tolerance compensation codes into the transmitted streaming data at regular intervals.

5. The integrated circuit defined in claim 2 further comprising programmable logic for implementing custom logic designs according to configuration data supplied by a user.

6. The integrated circuit defined in claim 2 further comprising:
   an idle code generator that generates idle codes; and
   a clock compensation code generator that generates clock tolerance compensation codes, wherein the transmitter circuitry and control circuitry are configured to insert the idle codes into the transmitted streaming data during gaps and are configured to insert the clock tolerance compensation codes into the transmitted streaming data at regular intervals.

7. The integrated circuit defined in claim 1 further comprising an idle code generator that generates idle codes, wherein the transmitter circuitry and control circuitry are configured to insert the idle codes into gaps in the regular data and priority data.

8. The integrated circuit defined in claim 1 further comprising a clock compensation code generator that generates clock tolerance compensation codes, wherein the transmitter circuitry and control circuitry are configured to insert the clock compensation codes into the regular data.

9. The integrated circuit defined in claim 1, wherein the transmitter circuitry, receiver circuitry, and control circuitry are compliant with a serial communications protocol having an optional clock tolerance compensation code feature that has been selected by a user when designing the integrated circuit, the integrated circuit further comprising:
   a clock compensation code generator that generates clock tolerance compensation codes, wherein the transmitter circuitry and control circuitry are configured to insert the clock compensation codes into the regular data.

10. The integrated circuit defined in claim 1 further comprising programmable logic for implementing custom logic designs according to configuration data supplied by a user.

11. The integrated circuit defined in claim 1, wherein the receiver circuitry comprises a clock and data recovery circuit for extracting an embedded clock signal from the transmitted regular data and transmitted priority data.

12. The integrated circuit defined in claim 1 wherein the transmitter circuitry and control circuitry are configured to insert channel numbers into the transmitted regular data and the transmitted priority data for user channel multiplexing.

13. An integrated circuit that is compliant with a serial communications protocol having an optional data integrity protection feature that has been selected by a user when designing the integrated circuit, the integrated circuit comprising:
   transmitter circuitry for transmitting data over a serial communications link;
   receiver circuitry for receiving data over the serial communications link; and
   control circuitry that controls the transmitter circuitry and receiver circuitry, wherein the transmitter circuitry, receiver circuitry, and control circuitry are configured to implement the user-selected optional data integrity protection feature to provide error checking for data transmitted over the serial communications link, and wherein the transmitter circuitry and control circuitry are configured to test data packets for length and when a data packet is determined to have an odd length, add a pad byte to maintain word alignment of the data transmitted over the serial communications link.

14. The integrated circuit defined in claim 13 wherein the optional data integrity protection feature is adjustable and has at least two levels of associated data integrity protection for protecting transmitted data, wherein the transmitter circuitry, receiver circuitry, and control circuitry are further configured to implement one of the at least two levels of data integrity protection to check data transmitted over the serial communications link for errors.

15. An integrated circuit that is compliant with a serial communications protocol having an optional data integrity protection feature that has been selected by a user when designing the integrated circuit, the integrated circuit comprising:
  transmitter circuitry for transmitting data over a serial communications link;
  receiver circuitry for receiving data over the serial communications link; and
  control circuitry that controls the transmitter circuitry and receiver circuitry, wherein the transmitter circuitry, receiver circuitry, and control circuitry are configured to implement the user-selected optional data integrity protection feature to provide error checking for data transmitted over the serial communications link, wherein the optional data integrity protection feature is adjustable and has at least two levels of associated data integrity protection for protecting transmitted data, wherein the two levels of associated data integrity protection comprise CRC-16 and CRC-32, and wherein the transmitter circuitry, receiver circuitry, and control circuitry are further configured to implement CRC-16 to provide 16 bits of redundancy information for checking the data transmitted over the serial communications link for errors.

16. The integrated circuit defined in claim 13 further comprising programmable logic for implementing custom logic designs according to configuration data supplied by a user.

* * * * *